(12) United States Patent
Harjee et al.

(10) Patent No.: US 12,010,477 B2
(45) Date of Patent: *Jun. 11, 2024

(54) FORCE-ACTIVATED EARPHONE

(71) Applicant: Apple Inc., Cupertino, CA (US)

(72) Inventors: Nahid Harjee, Sunnyvale, CA (US); Brian R. Twehues, Campbell, CA (US); Teera Songatikamas, San Jose, CA (US); Aonan Li, Berkeley, CA (US); Travis N. Owens, Lakeway, TX (US); Kyle J. Campiotti, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/216,219

(22) Filed: Jun. 29, 2023

(65) Prior Publication Data

US 2023/0345166 A1 Oct. 26, 2023

Related U.S. Application Data

(63) Continuation of application No. 17/897,148, filed on Aug. 27, 2022, now Pat. No. 11,910,149, which is a
(Continued)

(51) Int. Cl.
*H04R 1/10* (2006.01)
*G06F 3/044* (2006.01)

(52) U.S. Cl.
CPC .......... *H04R 1/1041* (2013.01); *G06F 3/044* (2013.01); *H04R 1/1016* (2013.01);
(Continued)

(58) Field of Classification Search
CPC .. H04R 1/1041; H04R 1/1016; H04R 1/1075; H04R 2420/07; H04R 2201/10;
(Continued)

(56) References Cited

U.S. PATENT DOCUMENTS

| 7,538,760 B2 | 5/2009 | Hotelling et al. |
| 7,925,029 B2 * | 4/2011 | Hollemans ........... H04R 1/1041 381/328 |

(Continued)

FOREIGN PATENT DOCUMENTS

| CN | 202004935 | 10/2011 |
| CN | 203482367 | 3/2014 |

(Continued)

OTHER PUBLICATIONS

Electronic Paper: "Pay homage to Huawei, NDS capacitive pressure sensing touch solution boosts freebud pro to go ahead," Oct. 1, 2020, Retrieved on Jan. 19, 2021 from: https://ee-paper.com/pay-homage-to-huawei-ndt-capacitive-pressure-sensing-touch-solution-boosts-freebud-pro-to-go-ahead/, 9 pages.

*Primary Examiner* — Angelica M McKinney
(74) *Attorney, Agent, or Firm* — Brownstein Hyatt Farber Schreck, LLP

(57) ABSTRACT

An earphone includes a speaker housing; a speaker positioned in the speaker housing; a stem extending from the speaker housing, the stem defining an input surface; a conductive object disposed within the stem; a flexible circuit positioned between the stem and the conductive object; a member positioned between the flexible circuit and the conductive object operable to allow the flexible circuit to move with respect to the stem; a force sensor electrode disposed within the flexible circuit; and a controller operable to determine an input to the earphone using a change in capacitance detected using the force sensor electrode, the change in capacitance corresponding to a non-binary amount of a force applied to the input surface. In some examples, the earphone further includes a touch sensor electrode disposed within the flexible circuit.

20 Claims, 21 Drawing Sheets

Related U.S. Application Data continuation of application No. 17/219,799, filed on Mar. 31, 2021, now Pat. No. 11,463,797, which is a continuation-in-part of application No. 16/539,515, filed on Aug. 13, 2019, now Pat. No. 11,070,904.

(60) Provisional application No. 62/734,389, filed on Sep. 21, 2018.

(52) U.S. Cl.
CPC . *H04R 1/1075* (2013.01); *G06F 2203/04105* (2013.01); *H04R 2420/07* (2013.01)

(58) Field of Classification Search
CPC .......... G06F 3/044; G06F 2203/04105; H03K 17/9625; H03K 2017/9613; H03K 2217/96076; H03K 2217/960775; H03K 17/975; H03K 17/962
See application file for complete search history.

(56) References Cited

U.S. PATENT DOCUMENTS

| | | |
|---|---|---|
| 8,168,908 B2 | 5/2012 | Heimann |
| 8,169,416 B2 | 5/2012 | Han |
| 8,266,697 B2 | 9/2012 | Jones |
| 8,331,603 B2 | 12/2012 | Martenson et al. |
| 8,436,823 B2 | 5/2013 | Kanehira et al. |
| 8,712,071 B2 | 4/2014 | Terlizzi et al. |
| 8,735,755 B2 | 5/2014 | Peterson |
| 8,780,074 B2 | 7/2014 | Castillo et al. |
| 8,823,675 B2 | 9/2014 | Sleeman |
| 8,824,712 B2 | 9/2014 | Sacha |
| 8,885,851 B2 | 11/2014 | Westenbroek |
| 9,118,990 B2 | 8/2015 | Hankey et al. |
| 9,128,558 B2 | 9/2015 | Cok et al. |
| 9,128,577 B2 | 9/2015 | Polishchuk |
| 9,182,859 B2 | 11/2015 | Coulson et al. |
| 9,223,445 B2 | 12/2015 | Sleeman et al. |
| 9,563,317 B2 | 2/2017 | Sleeman et al. |
| 9,654,104 B2 | 5/2017 | Rothkopf et al. |
| 9,671,898 B2 | 6/2017 | Hsieh et al. |
| 9,729,971 B2 | 8/2017 | Hosoi et al. |
| 9,779,676 B2 | 10/2017 | Al-Dahle et al. |
| 9,785,296 B2 | 10/2017 | Lee et al. |
| 9,977,499 B2 | 5/2018 | Westerman et al. |
| 10,117,012 B2 | 10/2018 | Saulsbury et al. |
| 10,123,107 B2 | 11/2018 | Lin et al. |
| 10,139,974 B2 | 11/2018 | Hong et al. |
| 10,165,349 B2 | 12/2018 | Park et al. |
| 10,231,045 B2 | 3/2019 | Lee et al. |
| 10,291,975 B2 | 5/2019 | Howell et al. |
| 10,379,574 B2 | 8/2019 | Kim |
| 10,394,396 B2 | 8/2019 | Chiang et al. |
| 10,534,468 B2 | 1/2020 | Chatterjee |
| 10,659,866 B2 | 5/2020 | Smith et al. |
| 10,671,273 B2 | 6/2020 | Jung et al. |
| 10,720,474 B2 | 7/2020 | Hwang et al. |
| 10,728,646 B2 | 7/2020 | Mohammadi et al. |
| 10,739,899 B2 | 8/2020 | Filiz et al. |
| 10,757,491 B1 | 8/2020 | Jackson |
| 10,999,667 B2 | 5/2021 | Yang |
| 11,070,904 B2 | 7/2021 | Harjee et al. |
| 11,206,473 B2 | 12/2021 | Ji et al. |
| 11,463,796 B2 | 10/2022 | Harjee et al. |
| 11,463,797 B2* | 10/2022 | Harjee ................ H04R 1/1016 |
| 11,463,799 B2 | 10/2022 | Harjee et al. |
| 11,761,830 B2* | 9/2023 | Chen ..................... H05K 1/118 |
| | | 73/780 |
| 11,785,372 B2 | 10/2023 | Panecki et al. |
| 2008/0130910 A1* | 6/2008 | Jobling .................. H04M 1/05 |
| | | 381/74 |
| 2008/0211383 A1 | 9/2008 | Deguchi et al. |
| 2008/0260176 A1 | 10/2008 | Hollemans et al. |
| 2009/0003641 A1* | 1/2009 | Van Der Bilt ........ H04R 1/105 |
| | | 381/374 |
| 2011/0091059 A1* | 4/2011 | Sacha .................... H04R 25/50 |
| | | 381/330 |
| 2011/0206215 A1 | 8/2011 | Bunk |
| 2012/0194553 A1 | 8/2012 | Osterhout et al. |
| 2013/0082973 A1 | 4/2013 | Wurzel et al. |
| 2015/0002452 A1 | 1/2015 | Klinghult |
| 2015/0264472 A1* | 9/2015 | Aase ..................... H04R 1/1091 |
| | | 381/74 |
| 2015/0358716 A1 | 12/2015 | Zhu et al. |
| 2016/0103544 A1 | 4/2016 | Filiz et al. |
| 2017/0094389 A1* | 3/2017 | Saulsbury ............ A61B 5/6817 |
| 2019/0098390 A1 | 3/2019 | Carino et al. |
| 2019/0297408 A1* | 9/2019 | Mohammadi ........ H04R 1/1016 |
| 2020/0075272 A1 | 3/2020 | Solis et al. |
| 2020/0100010 A1* | 3/2020 | Yang ....................... H04R 1/10 |
| 2020/0344536 A1 | 10/2020 | Jackson et al. |
| 2021/0108973 A1 | 4/2021 | Sun |
| 2021/0239544 A1 | 8/2021 | Chen et al. |
| 2022/0417641 A1 | 12/2022 | Harjee et al. |
| 2022/0417642 A1 | 12/2022 | Harjee et al. |
| 2022/0417643 A1 | 12/2022 | Harjee et al. |

FOREIGN PATENT DOCUMENTS

| | | |
|---|---|---|
| CN | 105190495 | 12/2015 |
| CN | 106210961 | 12/2016 |
| CN | 106851456 | 6/2017 |
| CN | 107682768 | 2/2018 |
| CN | 107728836 | 2/2018 |
| CN | 207321498 | 5/2018 |
| CN | 108174319 | 6/2018 |
| CN | 207560279 | 6/2018 |
| CN | 109976593 | 7/2019 |
| CN | 110267143 | 9/2019 |
| CN | 213958032 | 8/2021 |
| CN | 214591927 | 11/2021 |
| CN | 113810809 | 12/2021 |
| DE | 102020100391 | 7/2021 |
| JP | 2011134000 | 7/2011 |
| JP | 2014194591 | 10/2019 |
| KR | 100777383 | 11/2007 |
| WO | WO 06/129290 | 2/2006 |
| WO | WO 06/075275 | 7/2006 |
| WO | WO 07/049254 | 5/2007 |
| WO | WO 14/124173 | 8/2014 |
| WO | WO 17/105048 | 6/2017 |
| WO | WO 18/208093 | 11/2018 |
| WO | WO 20/060725 | 3/2020 |

* cited by examiner

FORCE-ACTIVATED EARPHONE

CROSS-REFERENCE TO RELATED APPLICATIONS

This application is a continuation of U.S. patent application Ser. No. 17/897,148, filed Aug. 27, 2022, which is a continuation of U.S. patent application Ser. No. 17/219,799, filed Mar. 31, 2021, now U.S. Pat. No. 11,463,797, which is a continuation-in-part of U.S. patent application Ser. No. 16/539,515, filed Aug. 13, 2019, now U.S. Pat. No. 11,070,904, which is a nonprovisional of and claims the benefit under 35 U.S.C. § 119(e) of U.S. Provisional Patent Application No. 62/734,389, filed Sep. 21, 2018, the contents of which are incorporated herein by reference as if fully disclosed herein.

FIELD

The described embodiments relate generally to earphones. More particularly, the present embodiments relate to force-activated earphones.

BACKGROUND

Earphones are often used to provide audio output to users of electronic devices without overly disturbing people around them. For example, headsets for personal electronic devices (such as computing devices, digital media players, music players, transistor radios, and so on) typically include a pair of earphones. These earphones are usually configured with ear cups that go over the user's ears or with ear pieces or speakers that insert into the user's ear canal in order to form an acoustic chamber with the user's ear. The earphones typically produce acoustic waves that are transmitted into that acoustic chamber through one or more acoustic ports. In this way, the user can hear the audio output without overly disturbing people in the environment around the user.

Many such earphones include no input devices. Instead, such earphones may be controlled using input devices incorporated into external electronic devices to which the earphones may be wired or wirelessly coupled.

Other earphones may include one or more input devices. For example, earphones may be configured with one or more buttons, dials, switches, sliders, and so on. Such input devices may be used to activate (e.g., provide input to) the earphone.

SUMMARY

The present disclosure relates to force-activated electronic devices, such as earphones. A non-binary amount of a force applied to a force input surface defined by a housing of the earphone is determinable using a change in a mutual capacitance between first and second force electrodes. A spring member disposed within the housing biases the first force electrode towards the housing and allows it to move towards the second force electrode when the force is applied. In some implementations, the earphone may detect touch on a touch input surface defined by the housing. In various examples of such an implementation, the earphone may determine the non-binary amount of the force upon detection of the touch. In a particular embodiment, the first and second force electrodes may be implemented using separate sections of a single flexible circuit. This flexible circuit may flex to allow the first force electrode to move toward the second force electrode when the force is applied. This flexible circuit may also flex to allow the first force electrode to move away from the second force electrode when the force is no longer applied.

In various embodiments, an earphone includes a speaker housing; a speaker positioned in the speaker housing; a stem extending from the speaker housing, the stem defining an input surface; a conductive object disposed within the stem; a flexible circuit positioned between the stem and the conductive object; a deformable material positioned between the flexible circuit and the conductive object operable to deform when a force is applied to the input surface; a touch sensor electrode disposed within the flexible circuit facing the stem; a force sensor electrode disposed within the flexible circuit facing the deformable material; and a shield. The shield is disposed between the touch sensor electrode and the force sensor electrode.

In some examples, the earphone further includes a controller that is operable to determine a first input to the earphone using a touch detected using the touch sensor electrode. In various implementations of such examples, the controller is operable to determine a second input to the earphone using a non-binary amount of the force, the non-binary amount of the force determined according to a change in capacitance detected using the force sensor electrode.

In a number of examples, the earphone further includes a controller, the touch sensor electrode includes a first touch sensor electrode and a second touch sensor electrode, and the controller is operable to detect a touch moving along the input surface using the first touch sensor electrode and the second touch sensor electrode. In various examples, the earphone further includes a controller that is operable to determine an input to the earphone using a touch detected using the touch sensor electrode and a non-binary amount of the force, the non-binary amount of the force determined according to a change in capacitance detected using the force sensor electrode. In some implementations of such examples, the conductive object is the controller. In various implementations of such examples, the controller is sputtered, plated, or deposited with conductive material.

In some examples, the earphone further includes an antenna assembly. In various implementations of such examples, the flexible circuit extends between the conductive object and the antenna assembly. In a number of examples, the deformable material is at least one of foam or gel.

In some embodiments, an earphone includes a speaker housing; a speaker positioned in the speaker housing; a stem extending from the speaker housing, the stem defining an input surface; a conductive object disposed within the stem; a flexible circuit positioned between the stem and the conductive object; a spring member positioned between the flexible circuit and the conductive object operable to bias the flexible circuit toward the stem and allow the flexible circuit to move toward the conductive object when a force is applied to the input surface; a touch sensor electrode disposed within the flexible circuit facing the stem; a force sensor electrode disposed within the flexible circuit facing the spring member; and a shield. The shield is disposed between the touch sensor electrode and the force sensor electrode.

In various examples, the spring member is formed of metal. In a number of examples, a first end of the flexible circuit overlaps a second end of the spring member. In some examples, the earphone further includes an antenna assembly, the flexible circuit is coupled to the antenna assembly, and the spring member is coupled to the conductive object.

In a number of implementations of such examples, the flexible circuit is positioned between the antenna assembly and the conductive object.

In some examples, the conductive object functions as a ground for the force sensor electrode. In various examples, a capacitance of the force sensor electrode changes as the flexible circuit moves with respect to the conductive object.

In a number of embodiments, an earphone includes a speaker housing; a speaker positioned in the speaker housing; a stem extending from the speaker housing, the stem defining an input surface; a conductive object disposed within the stem; a flexible circuit positioned between the stem and the conductive object; a member positioned between the flexible circuit and the conductive object operable to allow the flexible circuit to move with respect to the stem; a force sensor electrode disposed within the flexible circuit; and a controller. The controller is operable to determine an input to the earphone using a change in capacitance detected using the force sensor electrode, the change in capacitance corresponding to a non-binary amount of a force applied to the input surface.

In some examples, the flexible circuit is positioned around at least two sides of the conductive object. In various examples, the conductive object is coupled to the stem.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
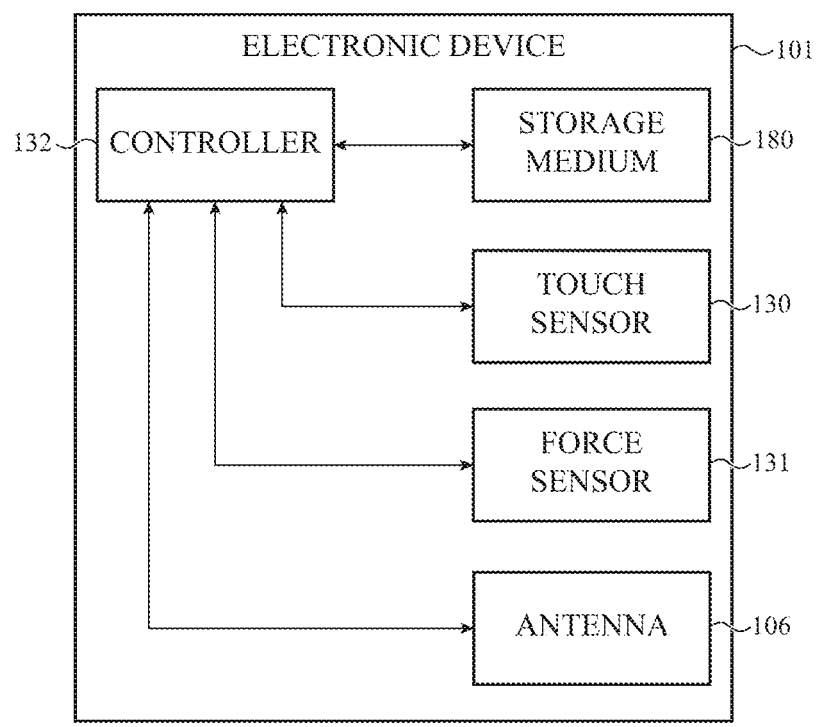
FIG. 1A depicts a block diagram illustrating example functional relationships between example components that may be implemented in an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The description that follows includes sample systems, methods, apparatuses, and products that embody various elements of the present disclosure. However, it should be understood that the described disclosure may be practiced in a variety of forms in addition to those described herein.

Earphones that include mechanical input devices (such as buttons, dials, switches, sliders, and so on) disposed on, or accessible through, a housing surface may be challenging to operate as a user may not be able to see the mechanical input devices while the earphones are worn. Some earphones may attempt to solve this by using input mechanisms that detect one or more taps from a user. However, though a user may be able to activate (e.g., provide input to) the earphone more easily by tapping than by locating a button to press, tapping the earphone may conduct sound. This may be unpleasant to the user. This may also disrupt audio output produced by the earphone. Further, in implementations where the earphone includes one or more microphones, the tapping may be picked up by a microphone.

The following disclosure relates to force-activated electronic devices, such as earphones. Embodiments may estimate or determine non-binary amounts of force applied to a force input surface on a housing by measuring a change in capacitance between first and second force electrodes. A spring member within the housing biases the first force electrode towards the housing while allowing it to move towards the second force electrode when the force is applied. In this way, the earphone can be activated by a force without requiring or using external mechanical input devices and/or without tapping.

In some implementations, an earphone may detect a touch on a touch input surface of the housing. In some embodiments, the earphone may determine a non-binary amount of input force upon detection of the touch. In this way, the earphone may improve power usage over implementations where force determination is performed more frequently. For example, the earphone may be a battery powered device and the improved power usage may improve battery life. In other implementations, the earphone may use signals from both a touch sensor and a force sensor to determine applied force by only using force detected when a touch is also detected.

In a particular embodiment, the first and second force electrodes may be implemented as separate sections of a single flexible circuit. This flexible circuit may flex to allow the first force electrode to move toward the second force electrode when the force is applied. This flexible circuit may also flex to allow the first force electrode to move away from the second force electrode when the force is no longer applied.

In certain embodiments, an earphone may detect touch on a first side of a stem and force on the other side of the stem. The sides where touch and force are detected may be opposite and substantially orthogonal with respect to each other (oriented 180 degrees) such that a user may simultaneously contact both sides when squeezing the stem between the user's fingers. The earphone may determine a force and use the force if a touch is detected, potentially ignoring the determined force if a touch is not detected. In this way, the earphone may use the touch and force detection of the two sides together to control operation of the earphone.

In some examples, the two sides may be oriented substantially perpendicular (90 degrees) from the user's head or other body part when in use to prevent or mitigate interference between the user's head and one or more sensors used to detect touch and/or force. For example, this orientation may prevent the two sides from touching the user's head or face during use of the earphone. The user's head or face touching the two sides could be falsely interpreted as input. As such, this orientation may reduce false inputs by preventing the user's head or face from touching the two sides during use.

However, it is understood that this is an example. In various implementations, the sides may be configured in other arrangements. For example, the two sides may be positioned 45 degrees away from each other and respectively 135 degrees away from the user when the user is wearing the earphone.

These and other embodiments are discussed below with reference to FIGS. 1A-9. However, those skilled in the art will readily appreciate that the detailed description given herein with respect to these figures is for explanatory purposes only and should not be construed as limiting.

FIG. 1A depicts a block diagram illustrating example functional relationships between example components that may be used to implement an electronic device 101. The electronic device 101 may include a controller 132 that is operative to interpret various touches to and/or forces exerted upon the electronic device 101 as input. For example, the electronic device 101 may be an earphone with one or more input surfaces defined on a housing. The controller 132 may use one or more touch sensors 130 and/or force sensors 131 to detect touches on one or more of the input surfaces, force applied to one or more of the input surfaces, and so on. For example, the electronic device 101 may include one or more mutual capacitance touch sensors, self-capacitance touch sensors, mutual capacitance force sensors, self-capacitance force sensors, strain gauges, optical sensors, pressure sensors, proximity sensors, switches, temperature sensors, dome switches, displacement sensors, and so on.

The electronic device 101 may also include an antenna 106, one or more non-transitory storage media 180 (which may take the form of, but is not limited to, a magnetic storage medium; optical storage medium; magneto-optical storage medium; read only memory; random access memory; erasable programmable memory; flash memory; and so on), and/or one or more other components. The controller 132 may execute instructions stored in the non-transitory storage medium 180 to perform various functions, such as using the touch sensor 130 to detect touch, using the force sensor 131 to detect applied force, using the antenna 106 to communicate with an associated device, and so on.

Figure 1B:
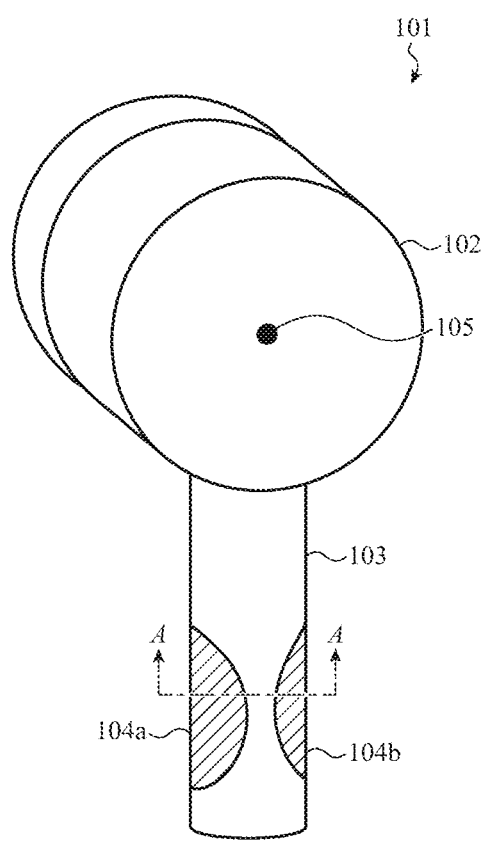
FIG. 1B depicts an example implementation of the electronic device of FIG. 1A.

FIG. 1B depicts an example implementation of the electronic device 101. As illustrated, in some implementations, the electronic device 101 may be an earphone. In this example, the electronic device 101 is a wireless earphone. However, it is understood that this is an example. In various implementations, the electronic device 101 may be any kind of electronic device, such as a mobile computing device, a stylus, and so on. Various configurations are possible and contemplated.

The electronic device 101 may include a housing including a speaker 102 and/or a speaker housing and a stem 103 and/or a stem housing. The stem 103 may define the input surfaces 104a, 104b. A user may be able to touch, press, hold, squeeze, and/or otherwise interact with one or more of the input surfaces 104a, 104b. This may allow the user to activate and/or otherwise provide touch, force, and/or other input to the electronic device 101.

The speaker 102 may define an acoustic chamber in cooperation with an ear of a user. In some implementations, the speaker 102 may also include a microphone acoustic port 105.

As illustrated, the input surfaces 104a, 104b may be defined on opposite sides (i.e., located opposite each other) of the stem 103. This positioning of the input surfaces 104a, 104b with respect to each other may allow force to be applied by squeezing the input surfaces 104a, 104b. As described above with respect to FIG. 1A, the electronic device 101 may include a number of different sensors for detecting touch on and/or force applied to one or more of the input surfaces 104a, 104b.

For example, the electronic device 101 may detect a non-binary amount of force applied to one or more input surfaces 104a, 104b. The amount of the force detected may be non-binary because the electronic device 101 is operative to determine an amount of the force that is applied within a range of force amounts rather than only a binary detection of whether or not force is applied. The electronic device 101 may interpret the applied force as a first input if the amount of the force is less than a force threshold. However, the electronic device 101 may interpret the force as a second input if the amount of the force at least meets the force threshold.

In some examples, the electronic device 101 may determine other information about touch or applied force. For example, the electronic device 101 (or controller or other processing unit thereof) may also determine an amount of time that a force is applied. The electronic device 101 may interpret force that is applied for an extended period of time as a different input than a force that is applied and then immediately released. In such an example, the electronic device 101 may interpret an applied force as multiple different kinds of input depending on the amount of the force that is applied, the amount of time that the force is applied, the direction that force is applied, and/or other aspects of the applied force.

In some implementations, the input surfaces 104a, 104b may be indents in the stem 103. This may provide a physical cue to guide a user to the input surfaces 104a, 104b. However, it is understood that this is an example. In other implementations, the input surfaces 104a, 104b may be otherwise configured without departing from the scope of the present disclosure. By way of illustration, in other implementations, the input surfaces 104*a*, 104*b* may be raised portions of the stem 103, ridges on the stem 103, and so on without departing from the scope of the present disclosure.

For example, in some implementations, the input surfaces 104*a*, 104*b* may be configured as protrusions from the stem 103. In other implementations, the input surfaces 104*a*, 104*b* may be physically contiguous with other sections of the stem 103 but may be indicated by a different color than the other sections of the stem 103. In still other implementations, the input surfaces 104*a*, 104*b* may be visually indistinguishable from other sections of the stem 103. Various configurations are possible and contemplated.

In some examples, the electronic device 101 may include both a force sensor and a touch sensor. For example, the force sensor may be positioned adjacent one of the input surfaces 104*a*, 104*b* and the touch sensor may be positioned adjacent the other of the input surfaces 104*a*, 104*b*. As such, the electronic device 101 may be operative to determine both touch and force to the input surfaces 104*a*, 104*b*.

In various examples, the electronic device 101 may use the force sensor to determine a non-binary amount of force applied only upon detection of a touch. This may prevent false readings, as objects other than a user could exert force on the housing. This may also reduce power consumption as compared to operating the force sensor more often or continuously. In examples where the electronic device 101 is powered by one or more batteries and/or is otherwise portable, this reduced power consumption may conserve the life of batteries and/or other components.

In other examples, the electronic device 101 may use the force sensor and a touch sensor to determine the amount of the force. For example, the electronic device 101 may use the force sensor regardless whether or not touch is detected, but may only use signals from the force sensor when a touch is detected.

In still other examples, force sensors may be positioned adjacent to both input surfaces 104*a*, 104*b*. Force sensors may be operated at different power levels. The higher the power level at which a force sensor is operated, the higher a signal to noise ratio of force data from a force sensor may be. Conversely, the lower the power level at which a force sensor is operated, the lower the signal to noise ratio of the force data may be, resulting in less accurate force data due to higher noise. Higher signal to noise ratio is desirable whereas higher power is not. As force data from two force sensors may be evaluated in this example to determine non-binary amounts of applied force, the force sensors may operate in a manner that is less accurate but uses less power. This may be due to the ability to combine the force data for a higher signal to noise ratio despite the lower powered operation of the individual force sensors. The use of the multiple sets of force data may make up for the less accurate but lower powered operation of either force sensor individually.

In yet other examples, multiple force sensors may be used for other purposes than increasing signal to noise ratios by averaging their data. For example, data from multiple force sensors may enable determination of force vector information. In other words, multiple force sensors may enable determination of both magnitude and direction of force. This force vector information may be used to discriminate between intentional application of force to provide input and accidental application of force, such as a user adjusting a position of the electronic device 101. Various configurations are possible and contemplated without departing from the scope of the present disclosure.

As illustrated, the input surfaces 104*a*, 104*b* may be substantially orthogonal to the microphone acoustic port 105. This may prevent the input surfaces 104*a*, 104*b* from touching a user's head during use of the electronic device 101.

Figure 1C:
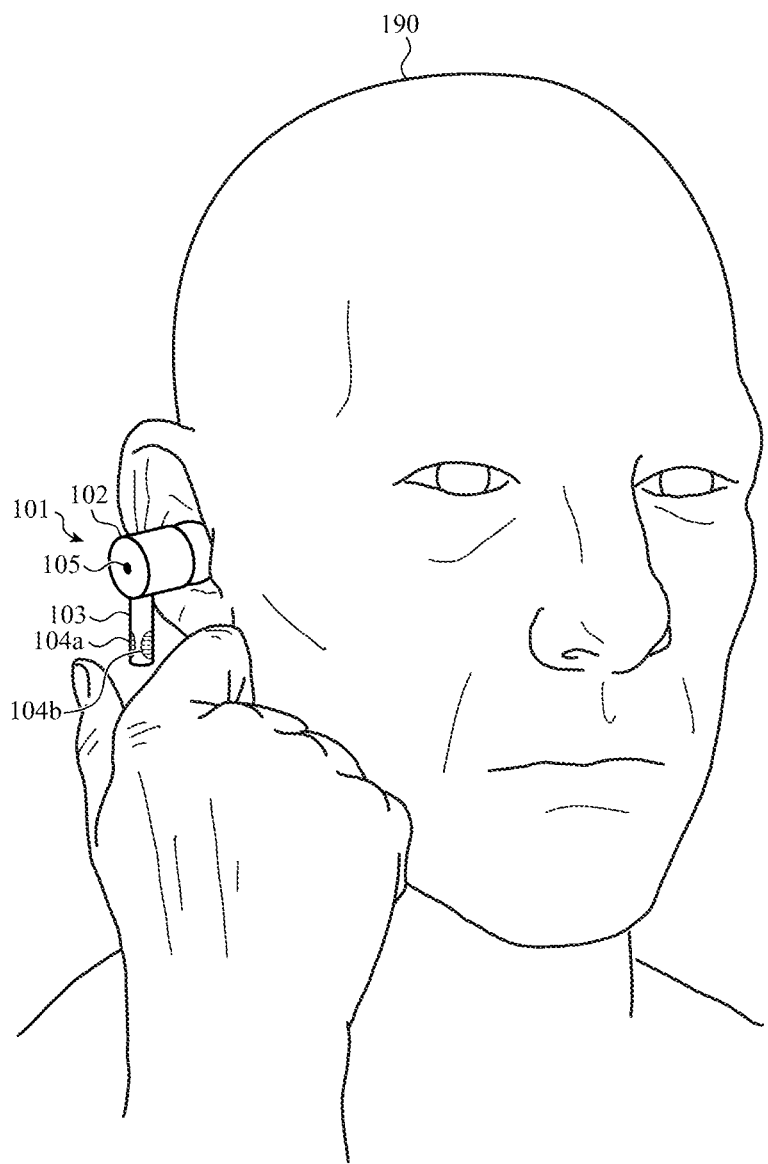
FIG. 1C depicts a user using the example electronic device of FIG. 1B.

FIG. 1C depicts a user 190 using the example electronic device 101 of FIG. 1B. As shown, the user may touch and exert force on the input surfaces 104*a*, 104*b* simultaneously by squeezing the input surfaces 104*a*, 104*b* between the user's finger and thumb. As also shown, the input surfaces 104*a*, 104*b* are positioned to prevent contact with the user's head during use of the electronic device 101.

Figure 1D:
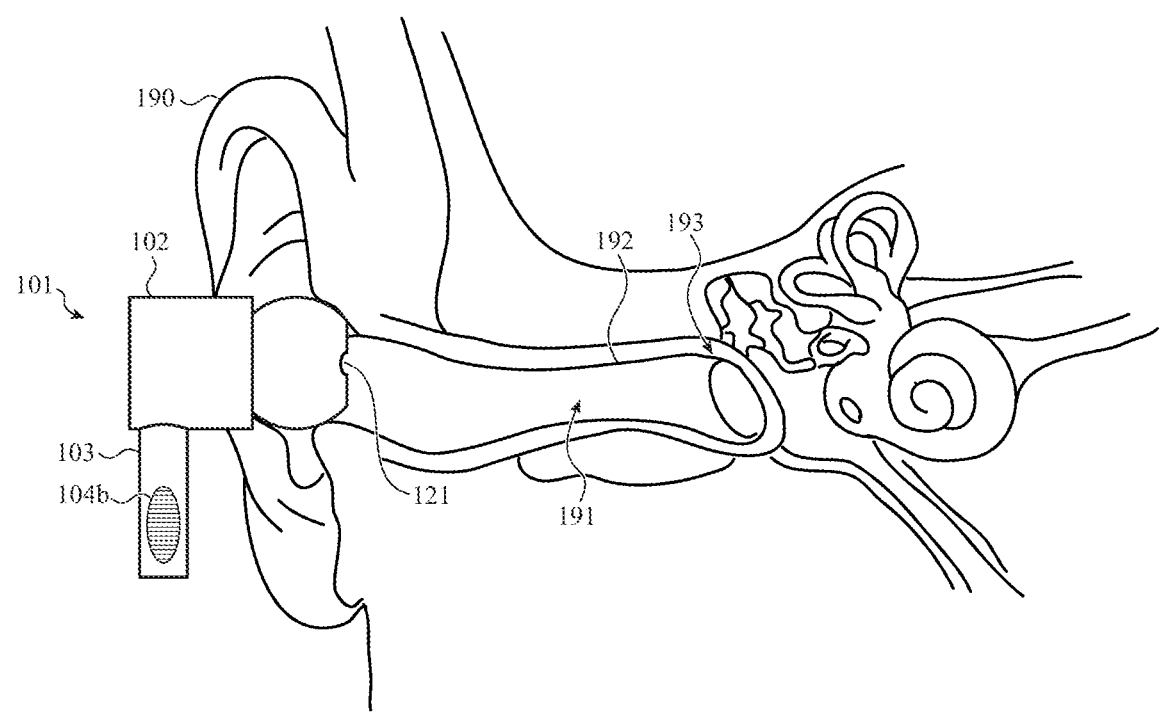
FIG. 1D depicts the electronic device of FIG. 1C forming an acoustic chamber with an ear canal of the user.

FIG. 1D depicts the electronic device 101 forming an acoustic chamber 191 with an ear canal 192 of the user 190. The acoustic chamber 191 may be defined by the speaker 102 of the electronic device 101 at one side of the ear canal 192 of the user 190 and by the eardrum 193 of the user 190 at the other side of the ear canal 192 of the user 190. The electronic device 101 may transmit sound waves into the acoustic chamber 191 through an output acoustic port 121. In this way, the user 190 may be able to hear the sound waves without overly disturbing people in the environment around the user 190.

Figure 2A:
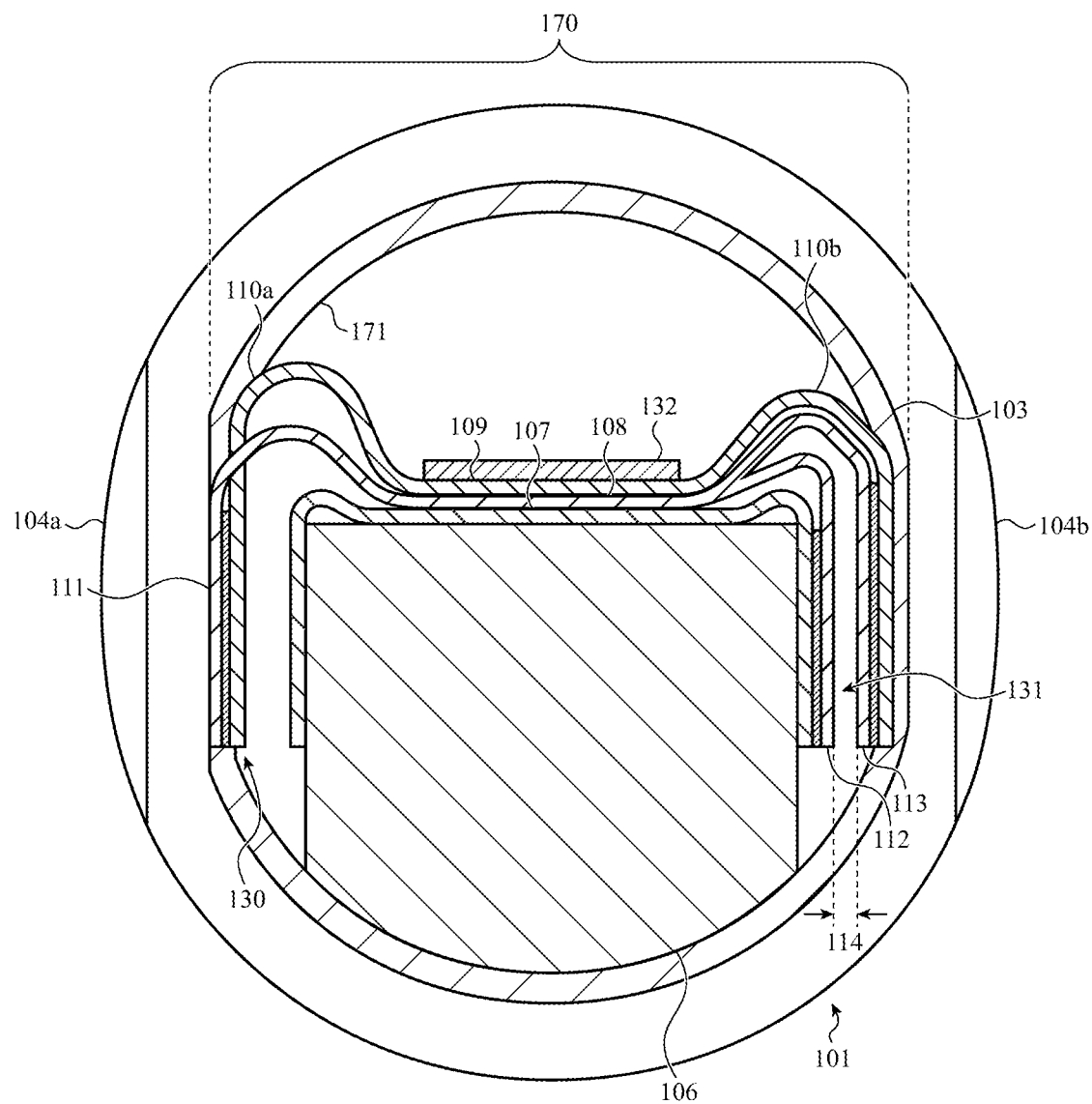
FIG. 2A depicts an example cross-sectional view of the electronic device of FIG. 1A, taken along line A-A of FIG. 1B.

FIG. 2A depicts an example cross-sectional view of the electronic device 101, taken along line A-A of FIG. 1B. An assembly 170 disposed within the stem 103 may include a flexible circuit 108, a spring member 109, an attachment spring member 107, an antenna 106, and a controller 132.

The flexible circuit 108 may form a touch sensor 130 adjacent the input surface 104*a* and a force sensor 131 adjacent the input surface 104*b*. As such, the input surface 104*a* may be a touch input surface and the input surface 104*b* may be a force input surface.

In various implementations, force applied to the force input surface may be determined or estimated upon detection of a touch to the touch input surface. This may reduce power consumption over implementations where force detection is constantly or more frequently performed.

In other examples, the force sensor 131 and touch sensor 130 may be used to determine the amount of the force. For example, the force sensor 131 may be operated regardless whether or not touch is detected, but signals from the force sensor 131 may only be used when the touch sensor 130 detects a touch. This may ensure that a user intentionally applied the force.

The flexible circuit 108 may include multiple circuitry sections that are connected to each other. For example, as shown, the flexible circuit 108 may include a first circuitry section 111, a second circuitry section 113, and a third circuitry section 112. The touch sensor 130 may be formed by the first circuitry section 111. The force sensor 131 may be formed by the second circuitry section 113 and the third circuitry section 112.

Figure 2B:
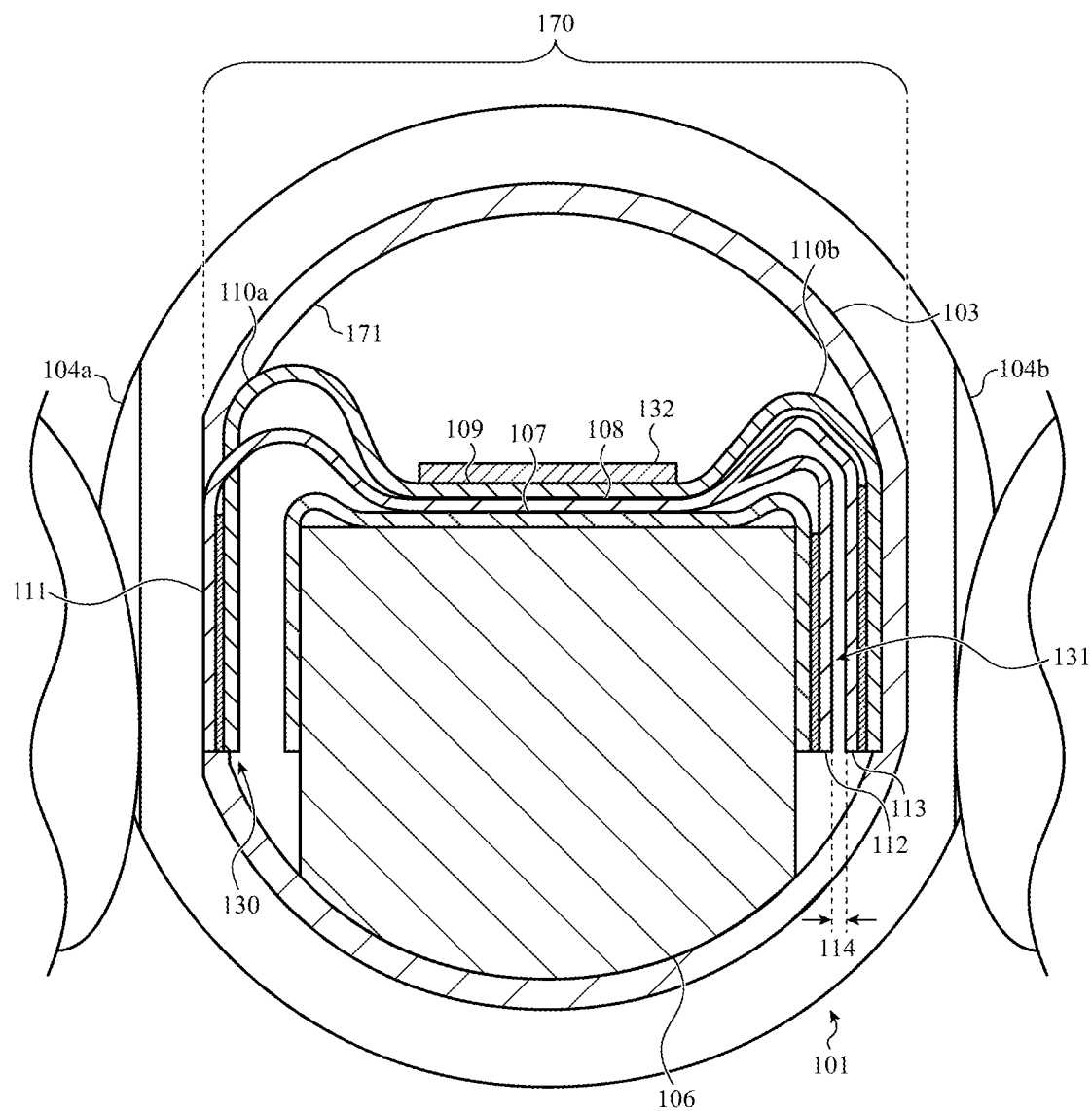
FIG. 2B depicts the electronic device of FIG. 2A when a force is applied to the input surfaces.

The flexible circuit 108 may be able to flex, bend, or otherwise deform to allow the second circuitry section 113 to move toward the third circuitry section 112 when a force is applied to the housing, such as the force input surface. This may reduce a gap 114 (which may be an air gap or otherwise be filled with a dielectric material such as silicone) between the second circuitry section 113 and the third circuitry section 112. The flexible circuit 108 may also be able to flex, bend, or otherwise deform to allow the second circuitry section 113 to move away from the third circuitry section 112 when the force is no longer applied. FIG. 2B depicts the electronic device 101 of FIG. 2A when a force is applied to the input surfaces 104a, 104b.

With reference to FIGS. 2A and 2B, a spring member 109 may be disposed within the stem 103. The spring member 109 may bias the second circuitry section 113 toward the force input surface of the stem 103. In other words, the spring member 109 may maintain the second circuitry section 113 at an initial position (shown) in the absence of force, allow the second circuitry section 113 to move when force is applied that moves the stem 103, and allows the second circuitry section 113 to return to the initial position when the force is no longer applied. The spring member 109 may also bias the first circuitry section 111 toward the touch input surface of the stem 103.

The spring member 109 may be a torsion spring and/or any other kind of spring. The spring member 109 may be formed of metal, plastic, a combination thereof, and so on. The spring member 109 may include a first arm 110a and a second arm 110b such that the spring member 109 may have an M-shaped cross section. The first arm 110a may bias the first circuitry section 111 toward the touch input surface of the stem 103. The second arm 110b may bias the second circuitry section 113 toward the force input surface of the stem 103. In other implementations, the spring member 109 may be shaped otherwise, such as embodiments where the spring member 109 has a C-shaped cross-section, a U-shaped cross-section, and so on.

Various portions of the flexible circuit 108 may be coupled or connected to the spring member 109. For example, adhesive may couple the flexible circuit 108 to the spring member 109, the first circuitry section 111 to the first arm 110a, the second circuitry section 113 to the second arm 110b, and so on.

As shown, the first circuitry section 111 is positioned between the first arm 110a and an internal surface 171 of the stem 103. As also shown, the second arm 110b is shown positioned between the second circuitry section 113 and the internal surface 171 of the stem 103. However, these are examples. In various implementations, these positions may be reversed and/or otherwise changed without departing from the scope of the present disclosure.

This configuration of the flexible circuit 108 and the spring member 109 may allow the touch sensor 130 and/or the force sensor 131 to be disposed within the stem 103 without being laminated and/or otherwise affixed to the stem 103. This may simplify manufacture of the electronic device 101.

The flexible circuit 108 may be coupled to an attachment spring member 107 (the spring member 109 being a movement spring member since the spring member 109 facilitates movement rather than attaching the flexible circuit 108) or other attachment member, such as using adhesive. The attachment spring member 107 may clamp or otherwise attach around an antenna 106. The antenna 106 may be an assembly including an antenna carrier with an antenna resonator made of conductive material (such as gold, silver, copper, alloys, or the like) disposed thereon. The antenna 106 may be held in place by the stem 103. By being coupled to the antenna 106, other elements (such as the attachment spring member 107, the flexible circuit 108, and the spring member 109) may be held in place as well.

Although the above illustrates and describes the attachment spring member 107 as attached around the antenna 106, it is understood that this is an example. In other implementations, the attachment spring member 107 and/or other elements (such as the flexible circuit 108, the spring member 109, and so on) may be attached to other components without departing from the scope of the present disclosure. For example, in some implementations, the electronic device 101 may include a battery pack. In such an implementation, the attachment spring member 107 may be attached to the battery pack.

With respect to FIGS. 2A and 2B, a controller 132 or other processor or processing unit (or other control circuitry) may also be disposed in the stem 103. In some implementations the controller 132 may be an integrated circuit, a SIP (a system in a package or "SIP" may be a number of integrated circuits enclosed in one or more chip carrier packages that may be stacked using package on package), and so on. The controller 132 may be electrically and/or otherwise communicably coupled to various portions of the flexible circuit 108. The controller 132 may receive and/or evaluate touch data from the touch sensor 130, receive and/or evaluate force data from the force sensor 131, determine one or more touches using the touch data, determine a non-binary amount of applied force using the force data (and/or other information about the force, such as a duration that the force is applied), and so on. The controller 132 may be connected to a non-transitory storage medium that may store instructions executable by the controller 132.

In various implementations, the controller 132 may only use the force sensor 131 to detect a force applied to the stem 103 or other portion of the housing (such as the input surface 104b) when the touch sensor detects a touch on the stem 103 or other portion of the housing (such as the input surface 104a). In some examples, the touch is on a first area of the housing and the force is applied to a second area of the housing. In various examples, the first area is located opposite the second area. In a number of examples, the first area and the second area are both positioned approximately 90 degrees from a user's head during use of the earphone. In various examples, the touch sensor 130 is inoperable to detect touches on the second area. In a number of examples, the controller 132 is operative to interpret the force as multiple different kinds of input.

Although the above illustrates and describes inputs as touches on and/or force applied to the input surfaces 104a, 104b, it is understood that this is an example. In various implementations, the electronic device 101 may be operable to detect touches on and/or force applied to other portions of the housing without departing from the scope of the present disclosure.

For example, the stem 103 may move when force is applied to areas orthogonal to the input surfaces 104a, 104b. This may cause the gap 114 to increase instead of decrease. Regardless, this may change the capacitance between the second circuitry section 113 and the third circuitry section 112. The non-binary amount of this force may thus be determined using the force data represented by the change in the mutual capacitance.

In some implementations, this change may be opposite the change in the mutual capacitance resulting from force exerted on the input surface 104b. As such, the location that the force is exerted may be determined based on the change in the mutual capacitance. Various configurations are possible and contemplated without departing from the scope of the present disclosure.

Although the above is illustrated and described in the context of a gap 114 between the second circuitry section 113 and the third circuitry section 112 that may reduce when a force is applied to the input surfaces 104a, 104b and increase when the force is no longer applied to the input surfaces 104a, 104b, it is understood that this is an example. In other examples, electrodes may be positioned such that a gap between the electrodes increases when a force is applied to the input surfaces 104a, 104b and reduce when the force is no longer applied to the input surfaces 104a, 104b. By way of illustration, such electrodes may be positioned adjacent the controller 132 and the internal surface 171 of the stem 103. Various configurations are possible and contemplated without departing from the scope of the present disclosure.

The flexible circuit 108 may be a flexible printed circuit board (e.g., a "flex"). In some implementations, the flexible circuit 108 may be formed of conductive material such as copper, silver, gold, or other metallic traces formed on a dielectric, such as polyimide or polyester.

The first circuitry section 111 that forms the touch sensor 130 may include one or more touch electrodes. For example, the first circuitry section 111 may include a touch drive electrode and a touch sense electrode. A touch on the touch input surface may be determined using a change in mutual capacitance of the touch drive electrode and the touch sense electrode. By way of another example, the first circuitry section 111 may include a single touch electrode and a touch to the touch input surface may be determined using a change in the self-capacitance of the single touch electrode.

The second circuitry section 113 that forms the force sensor 131 may include a first force electrode and the third circuitry section 112 may include a second force electrode. For example, in some implementations, the first force electrode may be a force drive electrode and the second force electrode may be a force sense electrode. In other implementations, these may be reversed. Changes in mutual capacitance between the second circuitry section 113 and the third circuitry section 112 (such as between first and second force electrodes respectively included in the second circuitry section 113 and the third circuitry section 112) may be used to determine a non-binary amount of the force.

As such, in some implementations, both the touch sensor 130 and the force sensor 131 may be capacitance sensors. Both may be mutual capacitance sensors. However, it is understood that this is an example. In various implementations, one or more of the touch sensor 130 and the force sensor 131 may be a self-capacitance sensor and/or another kind of sensor without departing from the scope of the present disclosure.

Figure 3A:
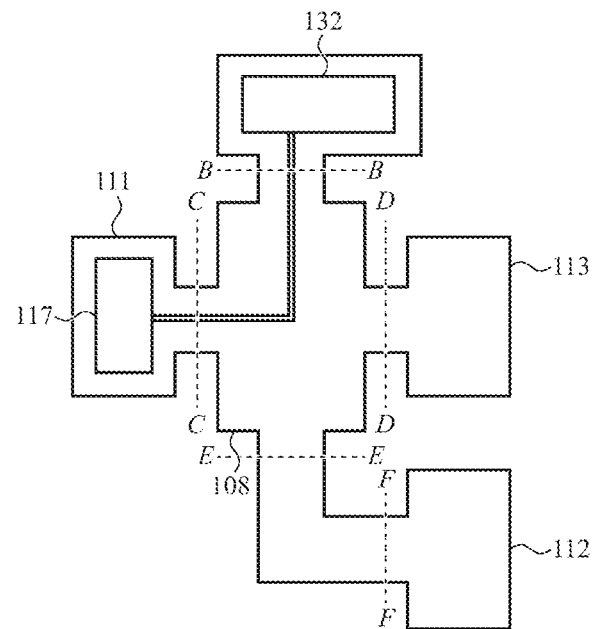
FIG. 3A depicts a first side of an example flexible circuit that may be used to implement the electronic device depicted in FIG. 2A.
Figure 3B:
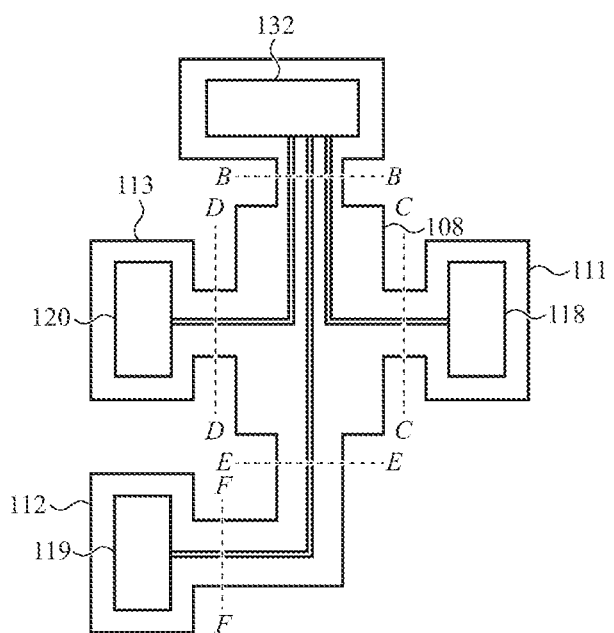
FIG. 3B depicts a second side of the example flexible circuit of FIG. 3A.

For example, FIG. 3A depicts a first side of an example flexible circuit 108 that may be used to implement the electronic device 101 depicted in FIG. 2A. FIG. 3B depicts a second side of the example flexible circuit 108 shown in FIG. 3A. FIGS. 3A and 3B illustrate how a single sheet or other structure of dielectric material (such as polyimide, polyester, and so on) may be configured to form the first circuitry section 111, the second circuitry section 113, and the third circuitry section 112; components such as the controller 132, the touch drive electrode 117, the touch sense electrode 118, the first force electrode 120, and the second force electrode 119 may be coupled thereto; and conductive material such as metal traces may be added thereto to connect such components. This single sheet or other structure may then be bent, folded, and/or otherwise deformed to configure the flexible circuit 108 as shown in FIGS. 2A-2B.

For example, the flexible circuit 108 may be folded along line C-C so that the first circuitry section 111 that includes the touch drive electrode 117 and the touch sense electrode 118 is positioned approximately perpendicular to a central portion of the flexible circuit 108. Similarly, the flexible circuit 108 may be folded along lines D-D and F-F so that the second circuitry section 113 that includes the first force electrode 120 and the third circuitry section 112 that includes the second force electrode 119 are positioned approximately perpendicular to the central portion of the flexible circuit 108. The flexible circuit 108 may then be folded along line E-E so that the second circuitry section 113 that includes the first force electrode 120 and the third circuitry section 112 that includes the second force electrode 119 are positioned approximately parallel to each other. Finally, the flexible circuit 108 may be folded along line B-B to position the controller 132 over the central portion of the flexible circuit 108. This may result in a configuration similar to that shown in FIGS. 2A-2B and FIG. 4.

Figure 4:
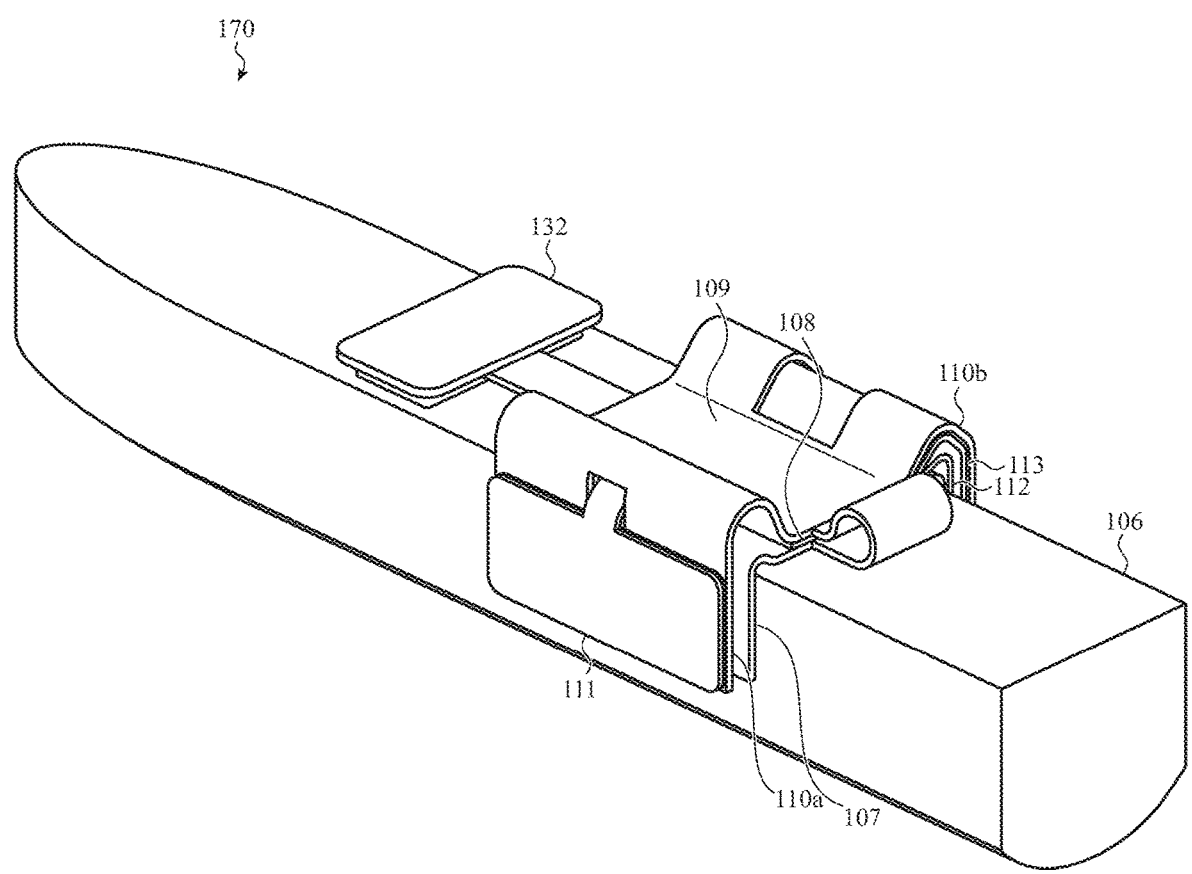
FIG. 4 depicts the assembly of the electronic device of FIG. 2A with the housing removed.

FIG. 4 depicts the assembly 170 of the electronic device 101 of FIG. 2A, including the antenna 106, with the housing removed. FIGS. 2A-2B illustrate the portions of the spring member 109, the first arm 110a, the first circuitry section 111, the second arm 110b, and the second circuitry section 113 that contact the stem 103 as substantially flat. However, it is understood that this is an example and is depicted in this fashion for the purposes of simplicity and clarity. In various implementations, various features (such as one or more protrusions, domes, and/or other features) may be configured on or between one or more of these components without departing from the scope of the present disclosure. Various configurations are possible and contemplated.

Figure 5:
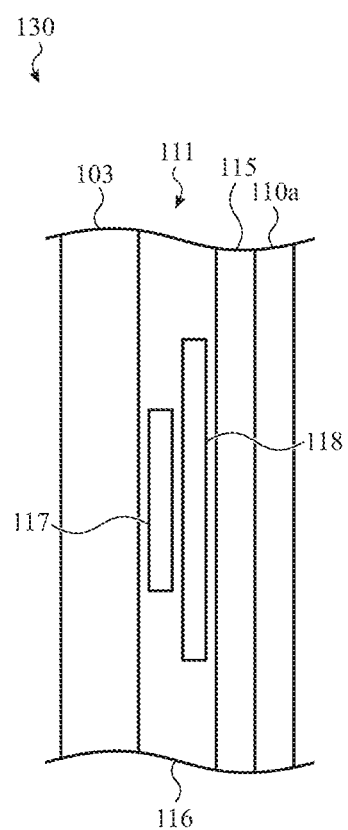
FIG. 5 depicts an example stack up that may be used to implement the touch sensor depicted in FIG. 2A.

FIG. 5 depicts an example stack up that may be used to implement the touch sensor 130 depicted in FIG. 2A. The orientation of the stack up may correspond to the position of the stem 103, the first circuitry section 111, and the first arm 110a illustrated in FIG. 2A. The stack up may include the stem 103, the first circuitry section 111, adhesive 115, and the first arm 110a. The first circuitry section 111 may include one or more touch drive electrodes 117 and touch sense electrodes 118 positioned on or within a dielectric 116 (such as polyimide, polyester, and so on).

A touch of a user on the stem 103 may alter a capacitance between the touch drive electrode 117 and the touch sense electrode 118. As illustrated in FIG. 3, a controller 132 may be electrically connected to the touch drive electrode 117 and the touch sense electrode 118 and may monitor the capacitance between the touch drive electrode 117 and the touch sense electrode 118 to determine when a touch occurs using changes in the capacitance.

The touch drive electrode 117 and the touch sense electrode 118 are illustrated as having a particular configuration and orientation with respect to each other. The configuration and orientation of the touch drive electrode 117 and the touch sense electrode 118 with respect to each other may affect the capacitance between the touch drive electrode 117 and the touch sense electrode 118 and how that capacitance changes when a user touches the stem 103. The touch drive electrode 117 and the touch sense electrode 118 may be arranged in a variety of different configurations and orientations to obtain specific properties with respect to the capacitance between the touch drive electrode 117 and the touch sense electrode 118 and how that capacitance changes when a user touches the stem 103.

Figure 6:
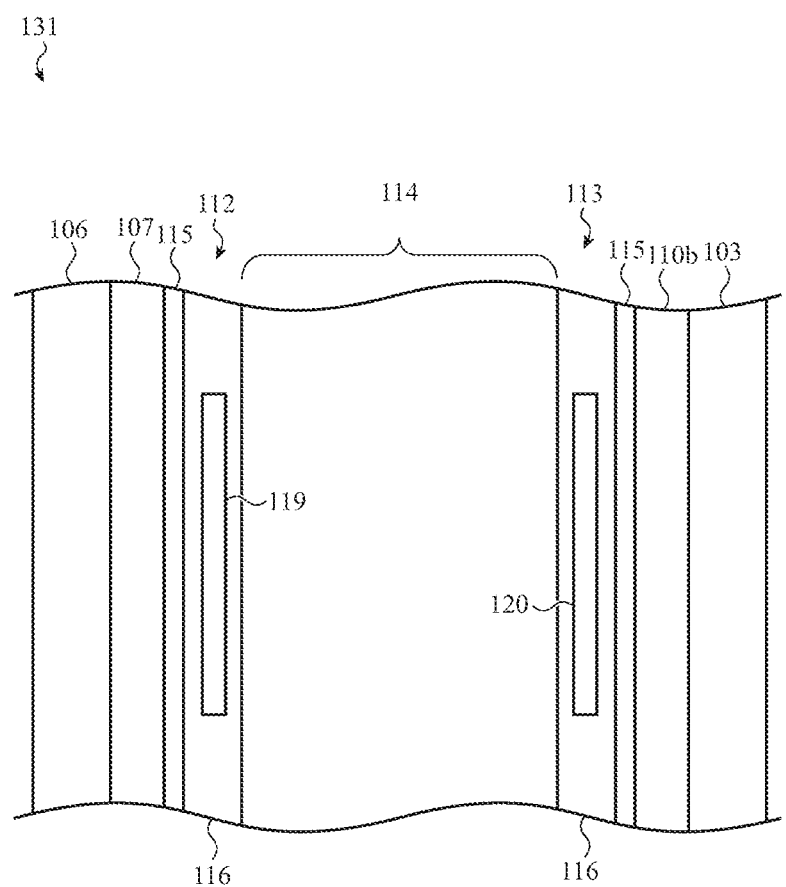
FIG. 6 depicts an example stack up that may be used to implement the force sensor depicted in FIG. 2A.

FIG. 6 depicts an example stack up that may be used to implement the force sensor 131 depicted in FIG. 2A. The orientation of the stack up may correspond to the position of the stem 103, the second arm 110b, the second circuitry section 113, the third circuitry section 112, the attachment spring member 107, and the antenna 106 in FIG. 2A. The stack up may include the antenna 106, the attachment spring member 107, adhesive 115, the third circuitry section 112, the gap 114, the second circuitry section 113, adhesive 115, the second arm 110b, and the stem 103. The second circuitry section 113 may include one or more first force electrodes 120 positioned on or within a dielectric 116 (such as polyimide, polyester, and so on). The third circuitry section 112 may include one or more second force electrodes 119 positioned on or within a dielectric 116 (such as polyimide, polyester, and so on). In some implementations, the first force electrode 120 may be a force drive electrode and the second force electrode 119 may be a force sense electrode. In other implementations, the first force electrode 120 may be a force sense electrode and the second force electrode 119 may be a force drive electrode.

Force exerted by a user on the stem 103 may alter the gap 114 between the first force electrode 120 and the second force electrode 119. Altering the gap 114 between the first force electrode 120 and the second force electrode 119 may alter a capacitance between the first force electrode 120 and the second force electrode 119. As illustrated in FIG. 3, a controller 132 may be electrically connected to the first force electrode 120 and the second force electrode 119 and may monitor the capacitance between the first force electrode 120 and the second force electrode 119 to determine or estimate a non-binary amount of the force that is applied using the changes in the capacitance.

The first force electrode 120 and the second force electrode 119 are illustrated as having a particular configuration and orientation with respect to each other. The configuration and orientation of the first force electrode 120 and the second force electrode 119 with respect to each other may affect the capacitance between the first force electrode 120 and the second force electrode 119 and how that capacitance changes when a user applies force to the stem 103. The first force electrode 120 and the second force electrode 119 may be arranged in a variety of different configurations and orientations to obtain specific properties with respect to the capacitance between the first force electrode 120 and the second force electrode 119 and how that capacitance changes when a user applies force to the stem 103.

FIGS. 2A-6 illustrate and describe touch sensors 130 and force sensors 131 having particular configurations and particular manners of operation. However, it is understood that these are examples and that other implementations are possible and contemplated. For example, the touch sensor 130 may be replaced with one or more proximity sensors without departing from the scope of the present disclosure.

By way of another example, in some implementations, one or more strain gauges may be laminated and/or otherwise coupled or attached to internal areas of the housing adjacent one or more of the input surfaces 104a, 104b. An applied force may cause strain in or on the housing. The strain gauges may detect the strain. Such strain data may be evaluated to determine a non-binary amount of the force exerted.

By way of yet another example, in some implementations, one or more touch or force sensors (and/or one or more touch sensing electrodes of such a touch or force sensor) may be laminated and/or otherwise coupled or attached to internal areas of the housing (and/or embedded within the housing) adjacent one or more of the input surfaces 104a, 104b. The housing may deform from an initial position when a force is applied and return to the initial position when the force is removed. As such, the housing may function as the spring member 109 in some embodiments. The touch or force sensors may detect the deformation and output signals that may be used to determine a touch and/or an amount of the applied force.

In some examples, one or more switches, such as one or more dome switches, may be positioned adjacent to the input surfaces 104a, 104b. Applied force may deform the housing, which may collapse the domes and close the switch. Output from the switches may be used to determine a non-binary amount of the applied force.

In various examples, one or more optical sensors may be disposed in the housing. The optical sensors may detect movement of the housing caused by the application of force. In such an example, output from the optical sensors may be evaluated to determine a non-binary amount of a force that is applied.

In a number of examples, one or more temperature sensors may be used to detect temperature changes of the input surfaces 104a, 104b. When the user 190 exerts different amounts of force on the input surfaces 104a, 104b, the body of the user 190 may change the temperature of the input surfaces 104a, 104b. For example, body heat of the user 190 may thermally conduct to the input surfaces 104a, 104b when the user 190 exerts force on the input surfaces 104a, 104b, raising the temperature of the input surfaces 104a, 104b. This thermally conducted heat may increase the temperature of the input surfaces 104a, 104b higher the more force the user 190 exerts. As such, a non-binary amount of the force may be determined based on the temperature changes detected by the temperature sensors.

In some examples, one or more pressure sensors may be disposed within the housing. The pressure sensor may measure the pressure of an internal cavity defined within the housing. Force applied to one or more of the input surfaces 104a, 104b may change the pressure of the internal cavity. The electronic device 101 may determine a non-binary amount of the force based on pressure changes detected by the pressure sensor.

Figure 7:
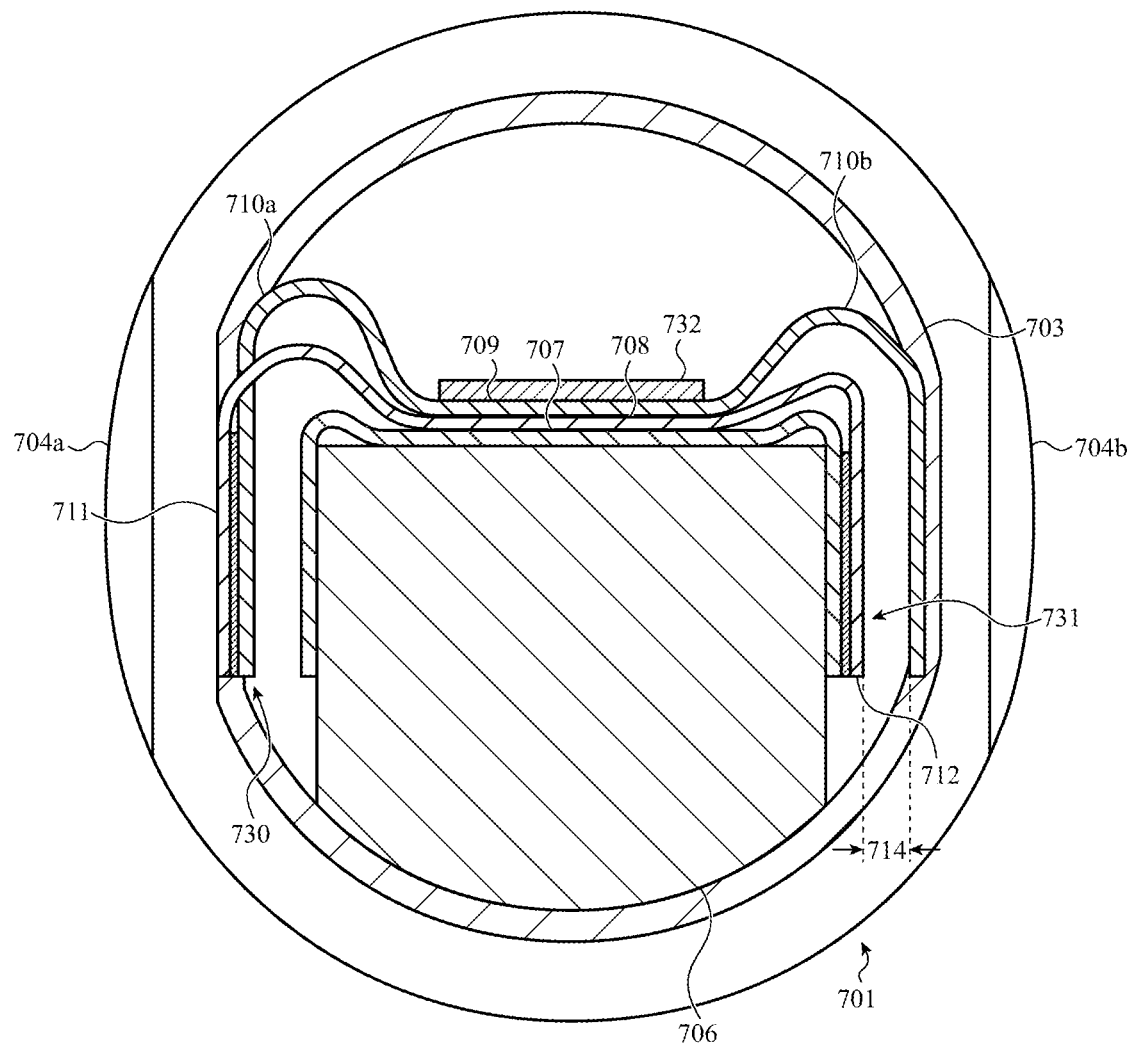
FIG. 7 depicts a first alternative example of the electronic device of FIG. 2A.

In various examples, force may be determined using self-capacitance of a force electrode. By way of illustration, FIG. 7 depicts a first alternative example of the electronic device 101 of FIG. 2A. The electronic device 701 may include a stem 703 of a housing that defines a touch input surface 704a and a force input surface 704b. The electronic device 701 may also include a flexible circuit 708 with a first circuitry section 711 that forms a touch sensor 730 and a second circuitry section 712 that forms a force sensor 731. The electronic device 701 may additionally include a spring member 709 with a first arm 710a that biases the first circuitry section 711 toward the touch input surface 704a and a second arm 710b.

The second circuitry section 712 may include a force electrode. The force sensor 731 may monitor the self-capacitance of that force electrode. The second arm 710b may function as a ground that affects the self-capacitance depending on the size of the gap 714 between the second circuitry section 712 and the second arm 710b. A non-binary amount of force applied to the force input surface 704b may be determined using changes in the self-capacitance of the force electrode.

Additionally, the electronic device 701 may include an antenna assembly 706, an attachment spring 707 that is coupled to the antenna assembly 706 and the flexible circuit 708. Moreover, the electronic device 701 may include a controller 732 that is electrically and/or otherwise communicably coupled to the flexible circuit 708.

In still other implementations, one or more of the components of the electronic device 701 may be changed. For example, in some implementations, the touch sensor 730 may be replaced with a proximity sensor. In such implementations, the force sensor 731 may be operated upon detection of proximity using the proximity sensor.

In other examples, the touch sensor 730 may be replaced with another force sensor. The force sensor may be similar to the force sensor 731, the force sensor 131 of FIGS. 2A-2B (such as using third and fourth force electrodes that move with respect to each other when force is applied or removed where a non-binary amount of force may be determined based on changes in mutual capacitance between the third and fourth force electrodes), and/or otherwise configured. In such cases where multiple force sensors are used, touch or proximity may not be used to trigger operation of a force sensor. In such examples, the two force sensors may be operated more frequently. In some implementations, the two force sensors may be operated at a lower power that yields less accurate measurements. The less accuracy of the measurement may be compensated for by using the additional force data supplied from having multiple force sensors.

In some implementations, the touch input surface 704*a* and the force input surface 704*b* may be reversed. One or more of the touch sensor 730 or the force sensor 731 may be more sensitive to interference from proximity to a user's neck or other body part. As such, the respective sensor may be located so as to be as far from that body part as is possible to minimize interference. Various configurations are possible and contemplated without departing from the scope of the present disclosure.

Figure 8:
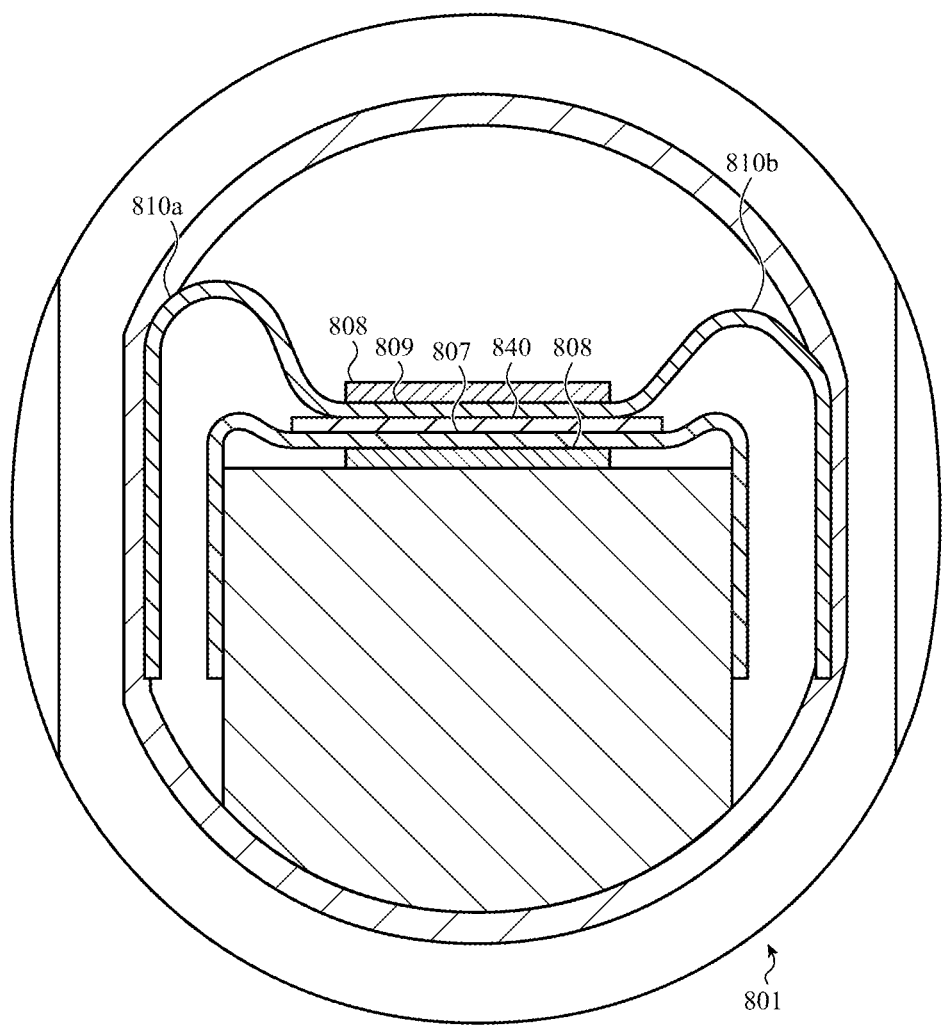
FIG. 8 depicts a second alternative example of the electronic device of FIG. 2A.

FIG. 8 depicts a second alternative example of the electronic device 101 of FIG. 2A. In this example, an electronic device 801 may electrically connect a flexible circuit 808 to a spring member 809 and an attachment spring member 807. An insulator 840 may separate and/or electrically isolate the spring member 809 and the attachment spring member 807 from each other. Movement of a first arm 810*a* and a second arm 810*b* with respect to the attachment spring member 807 changes a capacitance between the spring member 809 and the attachment spring member 807. In this example, the electronic device 801 may determine amounts of force applied using changes in capacitance between the spring member 809 and the attachment spring member 807. As such, the spring member 809 and the attachment spring member 807 may function as electrodes of a force sensor.

In some implementations of this example, the attachment spring member 807 may be used as a drive force sensor and the spring member 809 may be used as a sense force electrode. However, in other examples, the roles of these electrodes may be reversed without departing from the scope of the present disclosure.

Figure 9:
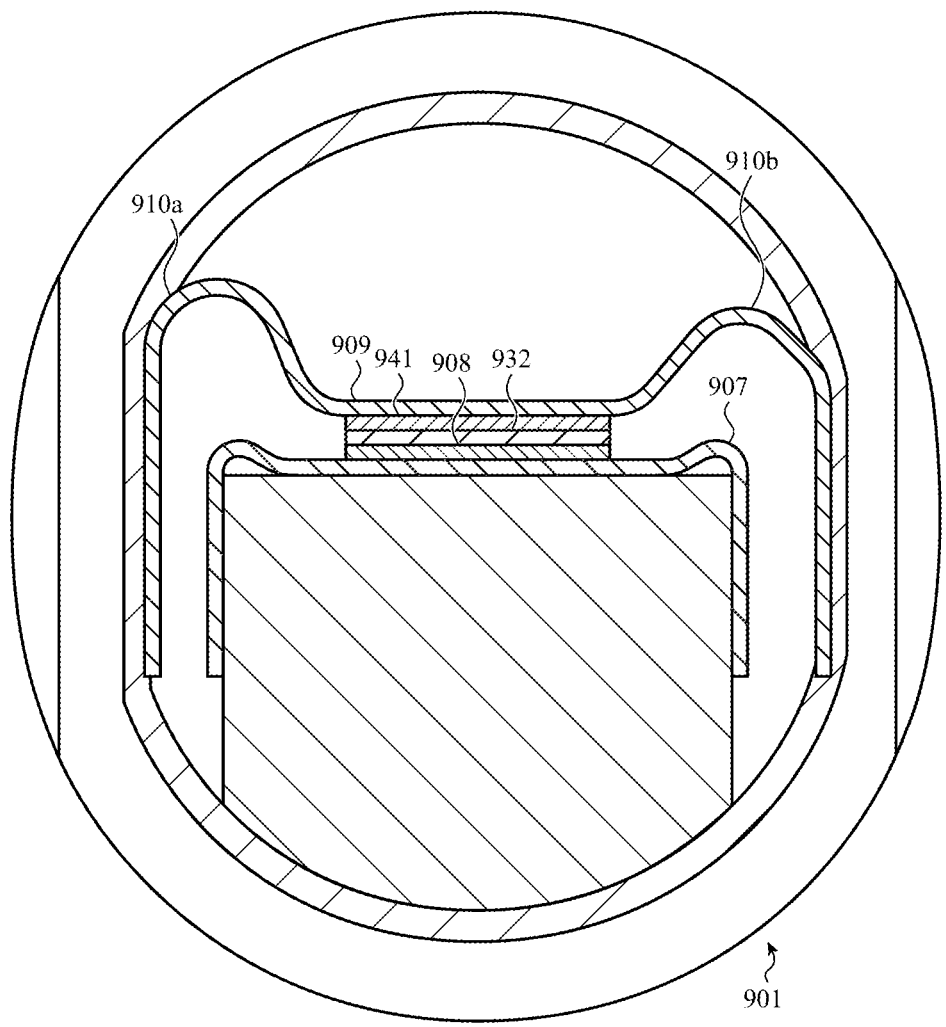
FIG. 9 depicts a third alternative example of the electronic device of FIG. 2A.

FIG. 9 depicts a third alternative example of the electronic device 101 of FIG. 2A. In this example electronic device 901, a controller 932 may be electrically connected to an attachment spring member 907 via a flexible circuit 908. The controller 932 may be operative to monitor a self-capacitance of the attachment spring member 907. A spring member 909 may also be coupled to the controller 932, such as via a laser weld 941 so as to be operable as a ground for the attachment spring member 907. Movement of a first arm 910*a* and a second arm 910*b* with respect to the attachment spring member 907 changes the self-capacitance of the attachment spring member 907. In this example, the electronic device 901 may determine amounts of force applied using changes in the self-capacitance of the attachment spring member 907.

Although this example uses the spring member 909 as a ground for the self-capacitance of the attachment spring member 907, it is understood that this is an example. In other implementations, the spring member 909 may be electrically connected to the controller 932 such that the controller 932 is operable to monitor a mutual capacitance between the spring member 909 and the attachment spring member 907.

Figure 10:
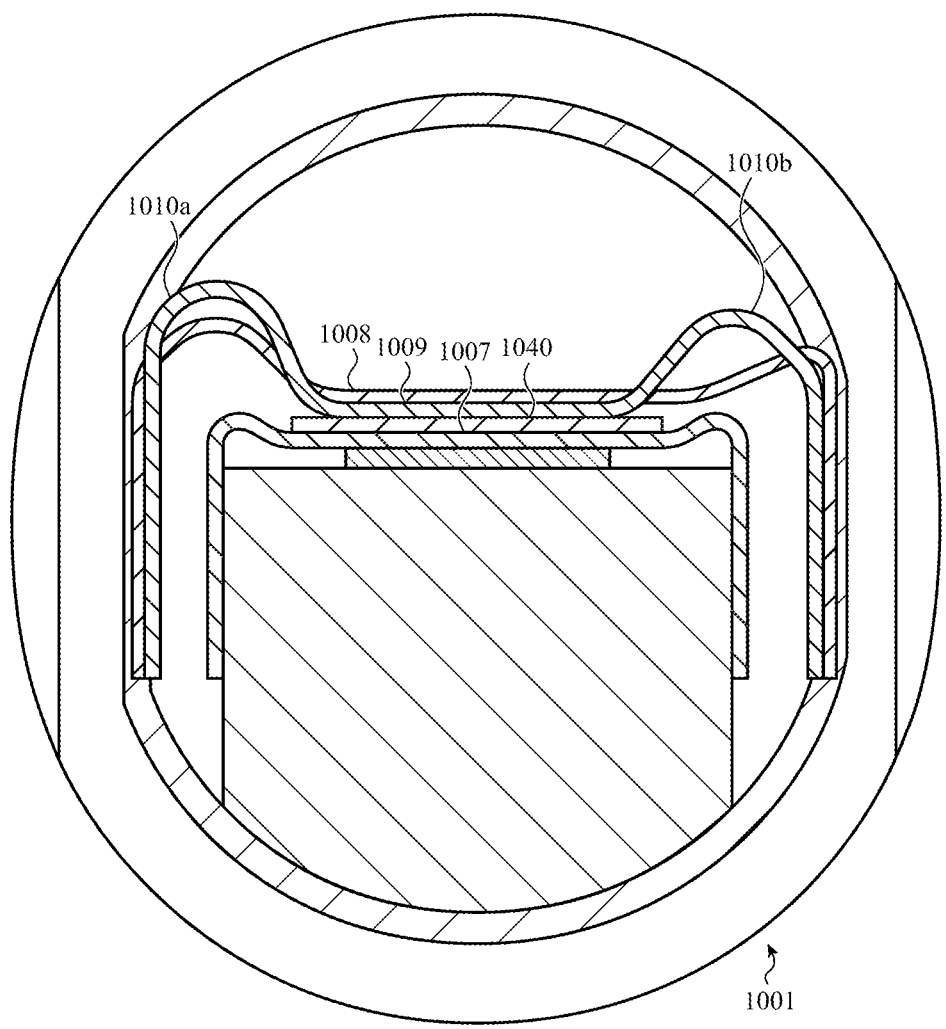
FIG. 10 depicts a fourth alternative example of the electronic device of FIG. 2A.

FIG. 10 depicts a fourth alternative example of the electronic device 101 of FIG. 2A. In this example electronic device 1001, a spring member 1009 may allow a flexible circuit 1008 to move with respect to an attachment spring member 1007 when force is applied. The flexible circuit 1008 may be electrically coupled to the attachment spring member 1007, which may be electrically isolated from the spring member 1009 by an insulator 1040. Movement of a first arm 1010*a* and a second arm 1010*b* of the spring member 1009 may change a capacitance between the attachment spring member 1007 and circuitry included in the flexible circuit 1008. The capacitance may be used to determine an amount of applied force. As such, the attachment spring member 1007 and/or one or more portions of the flexible circuit 1008 may form a force sensor and/or a touch sensor.

In other implementations, the insulator 1040 may be omitted. In such other implementations, the spring member 1009 may be coupled to the attachment spring member 1007 via a controller and a flexible circuit similar to how the controller 932 and the flexible circuit 908 of FIG. 9 connect the spring member 909 and the attachment spring member 907. Various configurations are possible and contemplated without departing from the scope of the present disclosure.

In various implementations, an earphone includes a housing, a flexible circuit disposed in the housing, and a controller disposed in the housing. The housing includes a speaker and a stem extending from the speaker and defining a touch input surface and a force input surface opposite the touch input surface. The flexible circuit includes a first circuitry section, a second circuitry section, and a third circuitry section. The flexible circuit flexes to allow the second circuitry section to move toward the third circuitry section when a force is applied to the force input surface and away from the third circuitry section when the force is no longer applied. The controller is operative to determine a touch to the touch input surface using a first change in a first mutual capacitance detected using the first circuitry section and a non-binary amount of the force using a second change in a second mutual capacitance detected using the second circuitry section and the third circuitry section.

In some examples, the controller uses the second circuitry section and the third circuitry section to determine the non-binary amount of the force upon determining the touch. In a number of examples, the earphone further includes an antenna disposed within the housing. The flexible circuit may be mounted to the antenna. In some examples, the speaker defines an acoustic port and the touch input surface and the force input surface are substantially orthogonal to the acoustic port.

In various examples, the controller determines an amount of time that the force is applied. In some examples, the controller interprets the force as a first input if the non-binary amount of the force is below a force threshold and a second input if the non-binary amount of the force at least meets the force threshold.

In some implementations, an electronic device includes a housing defining a force input surface, a first force electrode disposed within the housing, a second force electrode disposed within the housing, a spring member biasing the first force electrode toward the housing and allowing the first force electrode to move toward the second force electrode when an input force is applied to the force input surface, and a controller. The controller is operative to determine a non-binary amount of the force using a change in a capacitance between the first force electrode and the second force electrode. The capacitance may be a mutual capacitance.

In some examples, the electronic device further includes a touch sensor disposed within the housing. In some embodiments of such examples, the housing defines a touch input surface and the spring member includes a first arm that biases the touch sensor toward the touch input surface and a second arm that biases the first force electrode toward the force input surface.

In various examples, the spring member is at least one of metal or plastic. In a number of examples, the spring member has an M-shaped cross-section.

In some examples, the housing defines an additional force input surface. In some embodiments of such examples, the earphone further includes a third force electrode disposed within the housing adjacent to the additional force input surface and a fourth force electrode disposed within the housing. In such embodiments, the non-binary amount of the input force is determinable using the capacitance between the first force electrode and the second force electrode and an additional capacitance between the third force electrode and the fourth force electrode.

In a number of examples, the controller is operative to determine an additional force applied to an area of the housing other than the force input surface using an additional change in the capacitance between the first force electrode and the second force electrode. The area may be orthogonal to the force input surface and the additional change in the capacitance may be opposite the change in the mutual capacitance.

Figure 11:
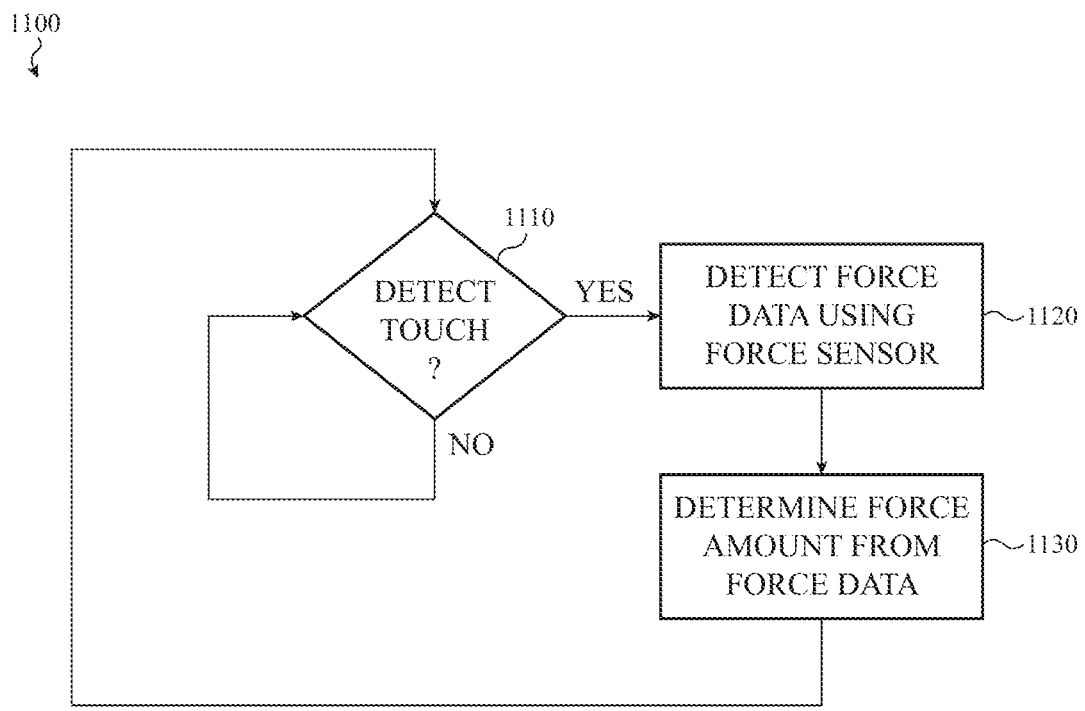
FIG. 11 depicts a flow chart illustrating an example method for operating a device that includes a force sensor. This method may be performed using the electronic device of FIGS. 1A-2B.

FIG. 11 depicts a flow chart illustrating an example method 1100 for operating a device that includes a force sensor. This method may be performed using the electronic device 101 of FIGS. 1A-2B.

At 1110, a controller determines whether or not a touch is detected. The controller may determine whether or not a touch is detected using one or more touch sensors. If so, the flow proceeds to 1120. Otherwise, the flow returns to 1110 where the controller again determines whether or not a touch is detected.

At 1120, after the touch is detected, the controller detects force data using a force sensor. The flow then proceeds to 1130 where the controller determines or estimates a non-binary amount of the force from the force data. The flow then returns to 1110 where the controller again determines whether or not a touch is detected.

Although the example method 1100 is illustrated and described as including particular operations performed in a particular order, it is understood that this is an example. In various implementations, various orders of the same, similar, and/or different operations may be performed without departing from the scope of the present disclosure.

For example, in some implementations, an action may be performed using the determined non-binary amount of the force. In some examples, the controller may interpret the determined non-binary amount of the force as an input. The controller may perform one or more actions according to the input corresponding to the determined non-binary amount of the force.

In various implementations, an earphone includes a housing, a spring member disposed within the housing that moves when a force is applied to the housing, a touch sensor coupled to the spring member, a touch sensor coupled to the spring member that is configured to detect a touch on the housing, a force sensor coupled to the spring member, and a controller that uses the force sensor and the touch sensor to determine an amount of the force.

In some examples, the touch is on a first area of the housing and the force is applied to a second area of the housing. In various such examples, the first area is located opposite the second area. In some such examples, the first area and the second area are both positioned approximately 90 degrees from a user's head during use of the earphone.

In various examples, the touch sensor is inoperable to detect touches on the second area. In some examples, the controller is operative to interpret the force as multiple different kinds of input.

Figure 12:
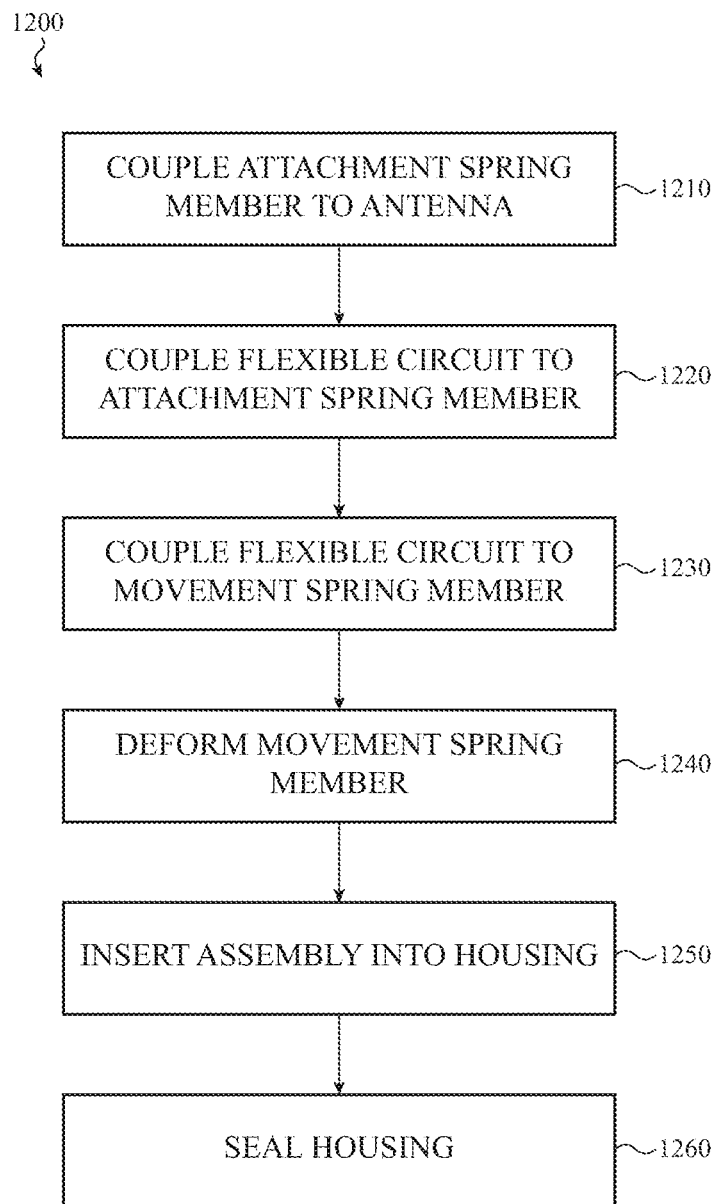
FIG. 12 depicts a flow chart illustrating an example method for assembling an electronic device. The method may assemble the electronic device of FIG. 2A.

FIG. 12 depicts a flow chart illustrating an example method 1200 for assembling an electronic device. The method 1200 may assemble the electronic device of FIG. 2A.

At 1210, an attachment spring member may be coupled to an antenna. At 1220, a flexible circuit may be coupled to the attachment spring member. At 1230, the flexible circuit may be coupled to a movement spring member. At 1240, the movement spring member may be deformed. For example, the movement spring member may be deformed so that the assembly produced by 1210-1230 can fit into an opening in a housing. At 1250, the assembly produced by 1210-1240 is inserted into a housing. At 1260, the housing is sealed.

For example, sealing the housing may include coupling a cap to an opening in a housing into which the assembly produced by 1210-1240 is inserted. The opening may be in an end of a stem of a housing. The electronic device may be an earphone with a housing that includes the stem and a speaker.

Although the example method 1200 is illustrated and described as including particular operations performed in a particular order, it is understood that this is an example. In various implementations, various orders of the same, similar, and/or different operations may be performed without departing from the scope of the present disclosure.

For example, the method 1200 is illustrated and described as deforming the movement spring member and then inserting the assembly produced by 1210-1240 into a housing. However, in some implementations, insertion of the assembly into the housing may deform the movement spring member sufficiently to allow insertion. In such implementations, a separate operation to deform the movement spring member may be omitted.

Figure 13:
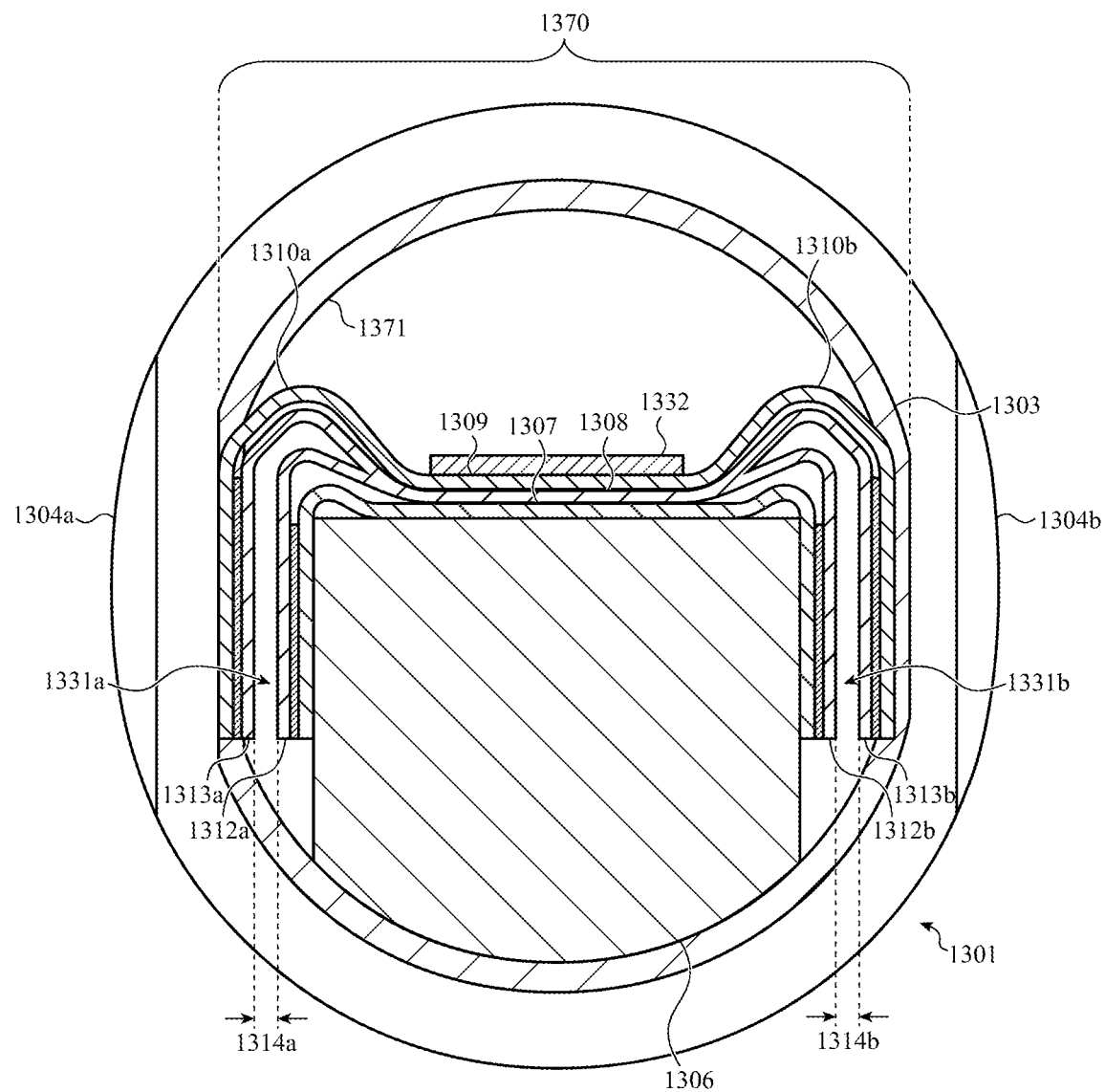
FIG. 13 depicts a fifth alternative example of the electronic device of FIG. 2A.

As discussed above, in some examples, the touch sensor 130 of the electronic device 101 of FIG. 2A may be replaced and/or supplemented with another force sensor 131. For example, FIG. 13 depicts a fifth alternative example of the electronic device 101 of FIG. 2A. Similar to the electronic device 101 of FIG. 2A, an electronic device 1301 may include an assembly 1370 disposed within a stem 1303 that may include a flexible circuit 1308, a spring member 1309, an attachment spring member 1307, an antenna 1306 or antenna assembly, and a controller 1332. Unlike the electronic device 101 of FIG. 2A, which includes the touch sensor 130, the flexible circuit 1308 of the electronic device 1301 may form a first force sensor 1331a adjacent the input surface 1304a and a second force sensor 1331b adjacent the input surface 104b. As such, the input surface 1304a and the input surface 1304b may both be force input surfaces.

In various implementations, one or more touch sensors may also be included (such as laminated and/or otherwise combined with one or more components of one or more of the first force sensor 1331a or the second force sensor 1331b and/or otherwise located) and one or more forces applied to one or more of the force input surfaces may be determined or estimated upon detection of one or more touches. This may reduce power consumption over implementations where force detection is constantly or more frequently performed.

In various examples, the first force sensor 1331*a* and the second force sensor 1331*b* may be cooperatively used to determine the amount of the force. In other examples, the first force sensor 1331*a* and the second force sensor 1331*b* may be separately and/or independently used to determine the amount of the force.

The flexible circuit 1308 may include multiple circuitry sections that are connected to each other. For example, as shown, the flexible circuit 1308 may include a first circuitry section 1313*a*, a second circuitry section 1312*a*, a third circuitry section 1313*b*, and a fourth circuitry section 1312*b* The first force sensor 1331*a* may be formed by the first circuitry section 1313*a* and the second circuitry section 1312*a*. The second force sensor 1331*b* may be formed by the third circuitry section 1313*b* and the fourth circuitry section 1312*b*.

The flexible circuit 1308 may be able to flex, bend, or otherwise deform to allow the first circuitry section 1313*a* to move toward the second circuitry section 1312*a* and/or to allow the third circuitry section 1313*b* to move toward the fourth circuitry section 1312*b* when one or more forces are applied to the housing, such as to one or more of the force input surfaces. This may reduce a respective gap 1314*a*, 1314*b* (which may be an air gap or otherwise be filled with a dielectric material such as silicone) between the first circuitry section 1313*a* and the second circuitry section 1312*a* and/or between the third circuitry section 1313*b* and the fourth circuitry section 1312*b*. The flexible circuit 1308 may also be able to flex, bend, or otherwise deform to allow the first circuitry section 1313*a* to move away from the second circuitry section 1312*a* and/or to allow the third circuitry section 1313*b* to move away from the fourth circuitry section 1312*b* when the force(s) is no longer applied.

As shown, the first circuitry section 1313*a* is positioned between a first arm 1310*a* of the spring member 1309 and an internal surface 1371 of the stem 1303. As also shown, a second arm 1310*b* of the spring member 1309 is shown positioned between the third circuitry section 1313*b* and the internal surface 1371 of the stem 1303. Additionally as shown, the second circuitry section 1312*a* and the fourth circuitry 1312*b* may be coupled to the attachment spring member 1307. However, these are examples. In various implementations, these positions may be reversed and/or otherwise changed without departing from the scope of the present disclosure.

Although a specific configuration of components is illustrated and described above with respect to FIG. 13, it is understood that this is an example. Other configurations are possible and contemplated without departing from the scope of the present disclosure. For example, the first force sensor 1331*a* and/or the second force sensor 1331*b* may be replaced in other implementations and/or supplemented with one or more strain gauges (such as one or more piezoelectric strain gauges, other types of strain gauges, and so on), touch sensors, and so on. Various configurations are possible and contemplated without departing from the scope of the present disclosure.

Although the above is illustrated and described in the context of a gap 1314*a* between the second circuitry section 1313*a* and the third circuitry section 1312*a* and a gap 1314*b* between the third circuitry section 1313*b* and the fourth circuitry section 1312*b* that may reduce when a force is applied to the input surfaces 1304*a*, 1304*b* and increase when the force is no longer applied to the input surfaces 1304*a*, 1304*b*, it is understood that this is an example. In other examples, electrodes may be positioned such that a gap between the electrodes increases when a force is applied to the input surfaces 1304*a*, 1304*b* and reduce when the force is no longer applied to the input surfaces 1304*a*, 1304*b*. By way of illustration, such electrodes may be positioned adjacent the controller 1332 and the internal surface 1371 of the stem 1303. Various configurations are possible and contemplated without departing from the scope of the present disclosure.

Figure 14:
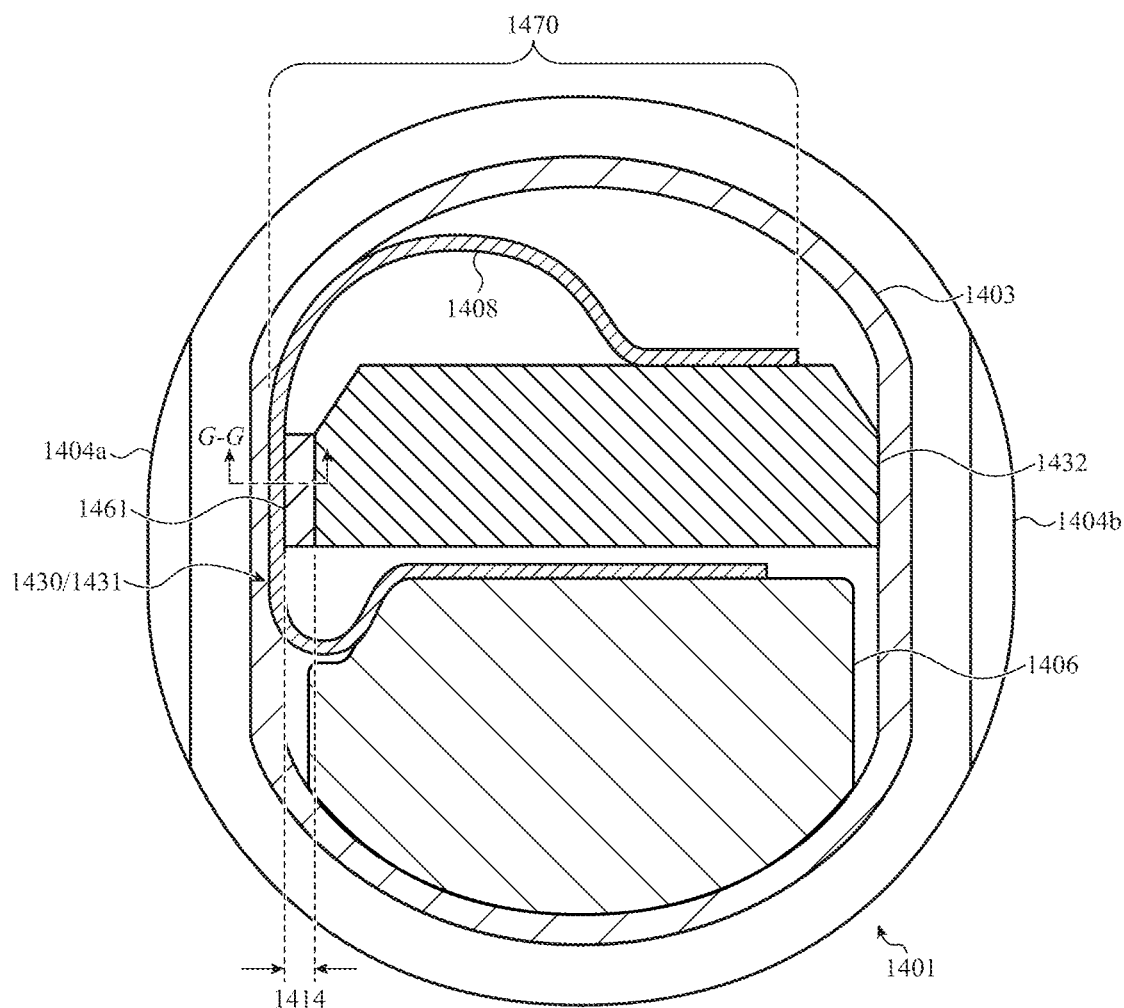
FIG. 14 depicts a sixth alternative example of the electronic device of FIG. 2A.

FIG. 14 depicts a sixth alternative example of the electronic device 101 of FIG. 2A. An electronic device 1401 may include an assembly 1470 disposed within a stem 1403 and/or a stem that may include a flexible circuit 1408, a deformable material 1461, an antenna 1406 or antenna assembly (which may be coupled to the stem 1403), and a conductive object 1432 (which may be coupled to the stem 1403). The conductive object 1432 may be a controller at least partially encased and/or enclosed in conductive material, such as sputter. For example, the controller may be sputtered, plated, or deposited with conductive material. The flexible circuit 1408 may include one or more touch sensors and/or force sensors and/or other components positioned adjacent an input surface 1404*a*. As such, the input surface 1404*a* may be a touch and/or force surface.

The deformable material 1461 may be capable of deforming. For example, the deformable material 1461 may deform when force is applied to the input surface 1404*a* and thus to the deformable material 1461 via the flexible circuit 1408, allowing the flexible circuit 1408 to move closer to the conductive object 1432. The deformable material 1461 may also return to an un-deformed configuration when the force is no longer applied, allowing the flexible circuit 1408 to move further away to the conductive object 1432. The deformable material may be formed of a foam, gel, spring member, and/or other material that is capable of deformation.

The electronic device 1401 may include one or more touch sensors 1430 and/or force sensors 1431. For example, the flexible circuit 1408 may include one or more touch electrodes and/or other touch sensors, one or more force electrodes and/or other force sensors, and so on. The controller included at least partially within the conductive object 1432 may use one or more of the one or more touch sensors 1430 and/or force sensors 1431 to detect touch on the stem 1403, estimate and/or determine a location of the touch, estimate and/or determine a duration of the touch, estimate and/or determine movement of the touch along the stem 1403, estimate and/or determine a non-binary amount of force exerted on the stem 1403, and so on. The controller included at least partially within the conductive object 1432 may interpret such touches, forces, locations, durations, movement, detections, estimations, determinations, combinations thereof, and so on as one or more inputs. For example, the controller included at least partially within the conductive object 1432 may interpret movement along the stem 1403 as an input to raise and/or lower a volume of media presented by the electronic device. Various configurations are possible and contemplated without departing from the scope of the present disclosure.

As discussed above, the flexible circuit 1408 may include a force electrode. In some examples, the conductive object 1432 may function as a ground for the force electrode such that a capacitance of the force electrode changes in proportion to the size of a gap 1414 between the flexible circuit 1408 and the conductive object As shown, the flexible circuit 1408 may be coupled to the antenna 1406 and/or the conductive object 1432. The flexible circuit 1408 may extend around multiple sides of the antenna 1406 and/or the conductive object 1432.

Figure 15A:
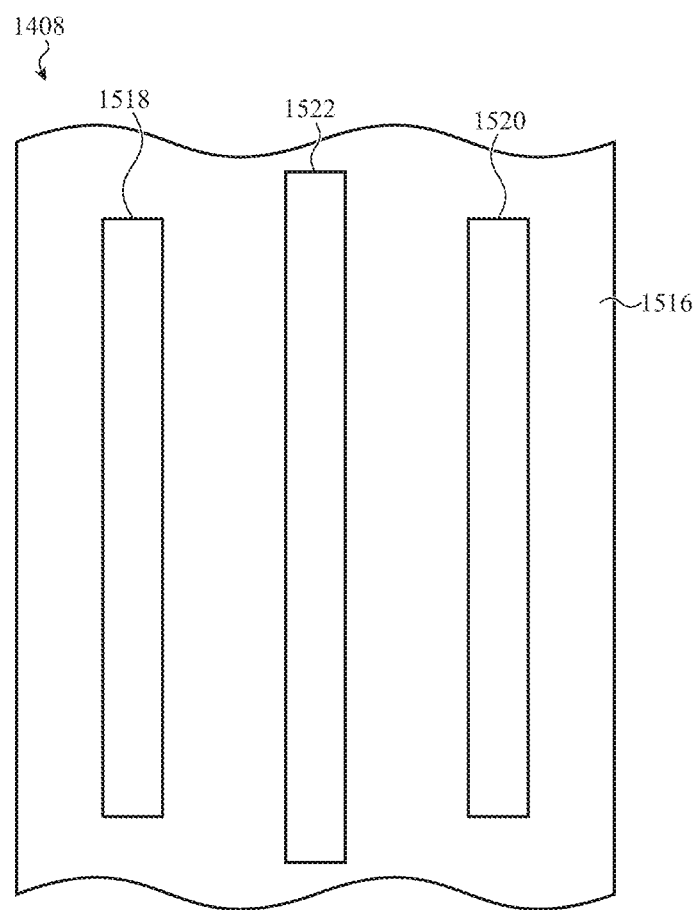
FIG. 15A depicts an example cross-sectional view of the flexible circuit of FIG. 14, taken along line G-G of FIG. 14.
Figure 15B:
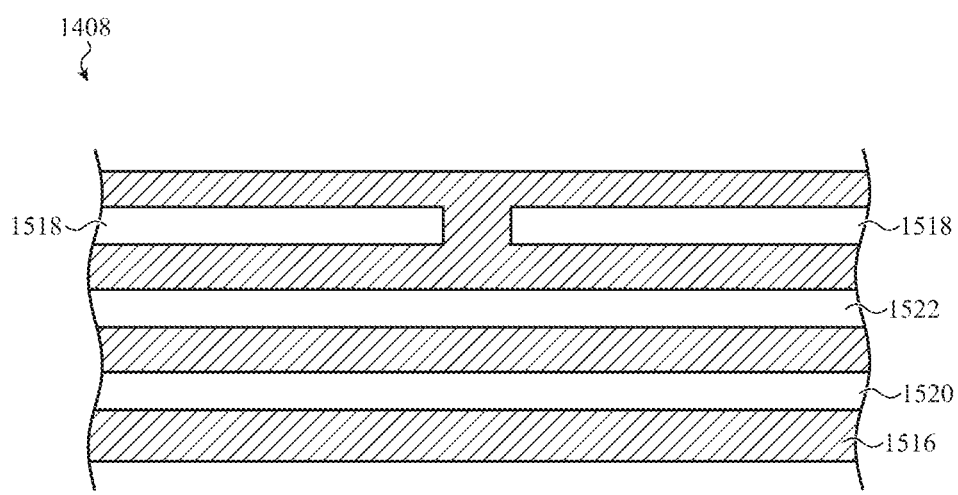
FIG. 15B depicts a side view of an example stack up of the flexible circuit shown in FIG. 15A.

FIG. 15A depicts an example cross-sectional view of the flexible circuit 1408 of FIG. 14, taken along line G-G of FIG. 14. FIG. 15B depicts a side view of an example stack up of the flexible circuit shown in FIG. 15A. With respect to FIGS. 14 and 15A-15B, the flexible circuit 1408 may include one or more dielectric materials 1516, one or more touch sensor electrodes 1518 disposed within the one or more dialectic materials 1516 facing (i.e. the direction in which the one or more touch sensor electrodes 1518 are capable of detecting touch) the stem 1403, one or more force sensor electrodes 1520 disposed within the one or more dialectic materials 1516 facing the deformable material (i.e. the direction in which the one or more force sensor electrodes 1520 are capable of detecting capacitance related to proximity between the one or more force sensor electrodes 1520 and the conductive object 1432), and one or more shields 1522 disposed within the one or more dialectic materials 1516 between the one or more touch sensor electrodes 1518 and the one or more force sensor electrodes 1520.

FIG. 15B depicts a side view of an example stack up of the flexible circuit 1408 shown in FIG. 15A. As shown, the flexible circuit 1408 may include multiple touch sensor electrodes 1518.

This configuration illustrated in FIGS. 14 and 15A-15B and described above may enable the one or more touch sensors 1430 to detect a touch (and/or a location of such a touch, a duration of such a touch, movement of such a touch, and so on) on the stem 1403 according to one or more changes in capacitance of the one or more touch sensor electrodes 1518 caused by a conductive object touching the stem 1403. This configuration may also enable the one or more force sensors 1431 to detect a non-binary amount of force exerted on the stem 1403 according to one or more changes in capacitance of the one or more force sensor electrodes 1520 caused by changes in proximity between the one or more force sensor electrodes 1520 and the conductive object 1432.

Although the electronic device 1401 is illustrated and described above as including a particular configuration of components, it is understood that this is an example. In other implementations, other configurations may be used without departing from the scope of the present disclosure. For example, in some implementations, the flexible circuit 1408 may be flexible yet semi-rigid such that the flexible circuit 1408 is operable to deform and move toward the conductive object 1432 when one or more forces are applied to the stem 1403 and return to an un-deformed position when the one or more forces are no longer applied. Various configurations are possible and contemplated without departing from the scope of the present disclosure.

Figure 16:
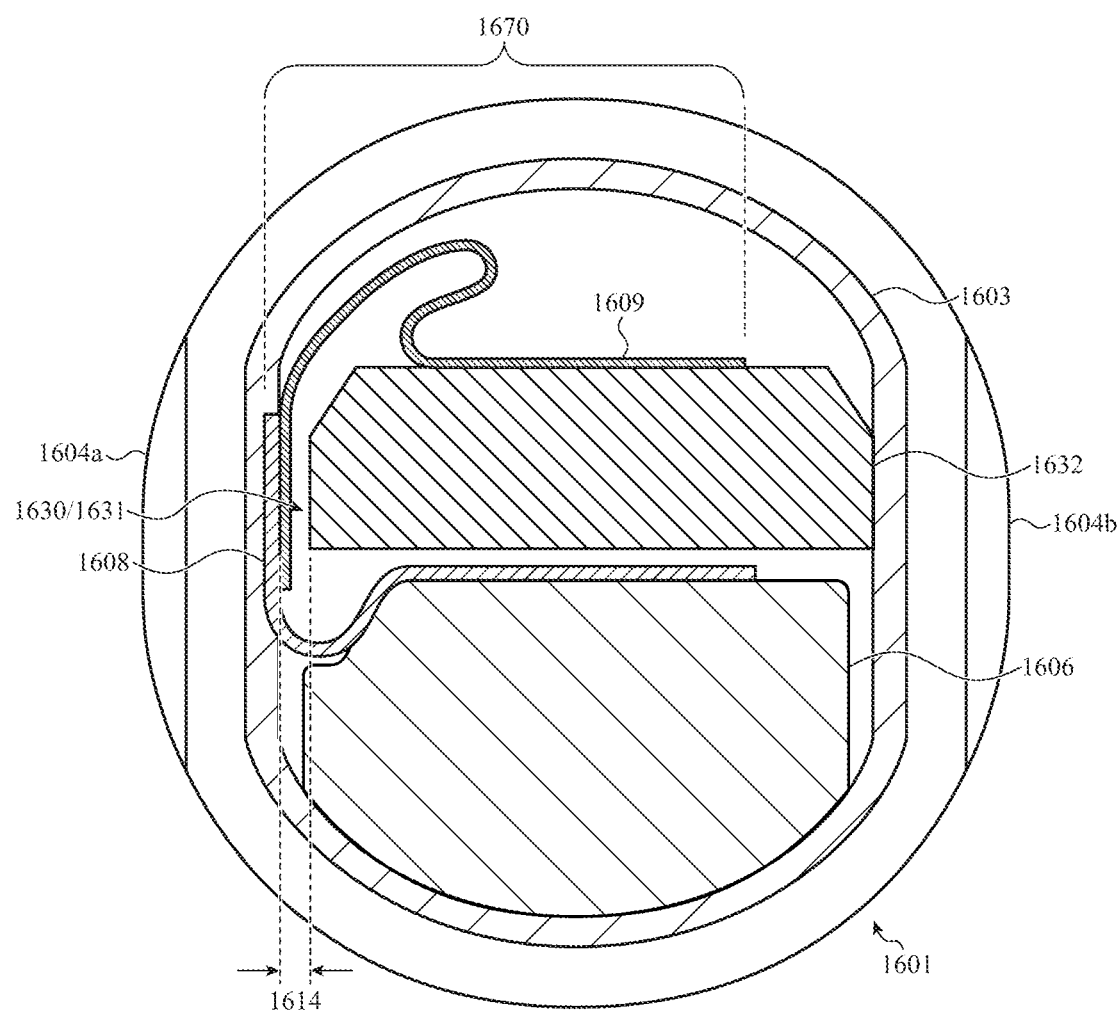
FIG. 16 depicts a seventh alternative example of the electronic device of FIG. 2A.

By way of another example, FIG. 16 depicts a seventh alternative example of the electronic device 101 of FIG. 2A. Similar to the electronic device 1401 of FIG. 14, the electronic device 1601 may include an assembly 1670 disposed within a stem 1603 and/or a stem that may include a flexible circuit 1608, an antenna 1606 or antenna assembly (which may be coupled to the stem 1603 and/or the flexible circuit 1608), and a conductive object 1632 (which may be coupled to the stem 1603 and/or include one or more controllers at least partially enclosed therein). Further to the electronic device 1401 of FIG. 14, the flexible circuit 1608 may include one or more touch sensors and/or force sensors and/or other components positioned adjacent an input surface 1604a. As such, the input surface 1604a may be a touch and/or force surface. However, by way of contrast with the electronic device 1401 of FIG. 14, the electronic device 1601 may omit the deformable material 1461. Instead, the electronic device 1601 may include a spring member 1609 disposed within the stem.

The spring member 1609 may be coupled to the conductive object 1632 (and/or the stem 1603 and/or other components in other implementations) and/or the flexible circuit 1608. The spring member 1609 may bias the flexible circuit 1608 toward the stem 103. In other words, the spring member 109 may maintain the flexible circuit 1608 at an initial position (shown) in the absence of force, allow the flexible circuit 1608 to move toward the conductive object 1632 when force is applied that moves the stem 103, and allows the flexible circuit 1608 to return to the initial position when the force is no longer applied. The spring member 1609 may be formed of metal, plastic, a combination thereof, and so on.

The electronic device 1601 may include one or more touch sensors 1630 and/or force sensors 1631. For example, the flexible circuit 1608 may include one or more touch electrodes and/or other touch sensors, one or more force electrodes and/or other force sensors, and so on. The controller included at least partially within the conductive object 1632 may use one or more of the one or more touch sensors 1630 and/or force sensors 1631 to detect touch on the stem 1603, estimate and/or determine a location of the touch, estimate and/or determine a duration of the touch, estimate and/or determine movement of the touch along the stem 1603, estimate and/or determine a non-binary amount of force exerted on the stem 1603, and so on. The controller included at least partially within the conductive object 1632 may interpret such touches, forces, locations, durations, movement, detections, estimations, determinations, combinations thereof, and so on as one or more inputs. For example, the controller included at least partially within the conductive object 1632 may interpret movement along the stem 1603 as an input to raise and/or lower a volume of media presented by the electronic device. Various configurations are possible and contemplated without departing from the scope of the present disclosure.

As discussed above, the flexible circuit 1608 may include a force electrode. In some examples, the conductive object 1632 may function as a ground for the force electrode such that a capacitance of the force electrode changes in proportion to the size of a gap 1614 between the flexible circuit 1608 and the conductive object.

As shown, a first end of the flexible circuit 1608 may overlap a second end of the spring member 1609. The flexible circuit may also be positioned between the antenna 1606 and the conductive object 1632.

Although the electronic device 1601 of FIG. 16 and the electronic device 1401 of FIG. 14 are illustrated and described above as including particular configurations of components, it is understood that these are examples. In other implementations, other configurations may be used without departing from the scope of the present disclosure. For example, electronic device 1601 of FIG. 16 and the electronic device 1401 of FIG. 14 are illustrated and described above as including a touch sensor 1430, 1630 and a force sensor 1431, 1631 positioned adjacent to the input surface 1404a, 1604a. However, in other implementations, such a touch sensor 1430, 1630 and/or a force sensor 1431, 1631 and/or one or more additional touch sensors 1430, 1630 and/or force sensors 1431, 1631 may instead and/or additionally be positioned adjacent to an input surface 1404b, 1604b and/or otherwise located. Various configurations are possible and contemplated without departing from the scope of the present disclosure.

By way of another example, the electronic device 1601 of FIG. 16 and the electronic device 1401 of FIG. 14 are illustrated and described above as respectively including an antenna 1406, 1606 and a conductive object 1432, 1632. However, in other implementations, one or more of these components may be omitted, combined, and so on. By way of illustration, in some implementations, an electronic device may include a controller at least partially encased and/or enclosed within conductive material, such as sputter. For example, the controller may be sputtered, plated, or deposited with conductive material. One or more portions of the conductive material may be removed in order to form one or more antennas and/or other components from the remaining conductive material. Various configurations are possible and contemplated without departing from the scope of the present disclosure.

In various implementations, an earphone may include a speaker housing; a speaker positioned in the speaker housing; a stem extending from the speaker housing, the stem defining an input surface; a conductive object disposed within the stem; a flexible circuit positioned between the stem and the conductive object; a deformable material positioned between the flexible circuit and the conductive object operable to deform when a force is applied to the input surface; a touch sensor electrode disposed within the flexible circuit facing the stem; a force sensor electrode disposed within the flexible circuit facing the deformable material; and a shield. The shield may be disposed between the touch sensor electrode and the force sensor electrode.

In some examples, the earphone may further include a controller that is operable to determine a first input to the earphone using a touch detected using the touch sensor electrode. In various such examples, the controller may be operable to determine a second input to the earphone using a non-binary amount of the force, the non-binary amount of the force determined according to a change in capacitance detected using the force sensor electrode.

In a number of examples, the earphone may further include a controller, the touch sensor electrode may include a first touch sensor electrode and a second touch sensor electrode, and the controller may be operable to detect a touch moving along the input surface using the first touch sensor electrode and the second touch sensor electrode. In various examples, the earphone may further include a controller that is operable to determine an input to the earphone using a touch detected using the touch sensor electrode and a non-binary amount of the force, the non-binary amount of the force determined according to a change in capacitance detected using the force sensor electrode. In some such examples, the conductive object may be the controller. In various such examples, the controller may be sputtered, plated, or deposited with conductive material.

In some examples, the earphone may further include an antenna assembly. In various such examples, the flexible circuit may extend between the conductive object and the antenna assembly. In a number of examples, the deformable material may be at least one of foam or gel.

In some implementations, an earphone may include a speaker housing; a speaker positioned in the speaker housing; a stem extending from the speaker housing, the stem defining an input surface; a conductive object disposed within the stem; a flexible circuit positioned between the stem and the conductive object; a spring member positioned between the flexible circuit and the conductive object operable to bias the flexible circuit toward the stem and allow the flexible circuit to move toward the conductive object when a force is applied to the input surface; a touch sensor electrode disposed within the flexible circuit facing the stem; a force sensor electrode disposed within the flexible circuit facing the spring member; and a shield. The shield may be disposed between the touch sensor electrode and the force sensor electrode.

In various examples, the spring member may be formed of metal. In a number of examples, a first end of the flexible circuit may overlap a second end of the spring member. In some examples, the earphone may further include an antenna assembly, the flexible circuit may be coupled to the antenna assembly, and the spring member may be coupled to the conductive object. In a number of such examples, the flexible circuit may be positioned between the antenna assembly and the conductive object.

In some examples, the conductive object may function as a ground for the force sensor electrode. In various examples, a capacitance of the force sensor electrode may change as the flexible circuit moves with respect to the conductive object.

In a number of implementations, an earphone may include a speaker housing; a speaker positioned in the speaker housing; a stem extending from the speaker housing, the stem defining an input surface; a conductive object disposed within the stem; a flexible circuit positioned between the stem and the conductive object; a member positioned between the flexible circuit and the conductive object operable to allow the flexible circuit to move with respect to the stem; a force sensor electrode disposed within the flexible circuit; and a controller. The controller may be operable to determine an input to the earphone using a change in capacitance detected using the force sensor electrode, the change in capacitance corresponding to a non-binary amount of a force applied to the input surface.

In some examples, the flexible circuit may be positioned around at least two sides of the conductive object. In various examples, the conductive object may be coupled to the stem.

As described above and illustrated in the accompanying figures, the present disclosure relates to force-activated electronic devices, such as earphones. A non-binary amount of a force applied to a force input surface defined by a housing is determinable using a change in capacitance between first and second force electrodes. A spring member disposed within the housing biases the first force electrode towards the housing and allows it to move towards the second force electrode when the force is applied. In some implementations, an earphone may detect touch on a touch input surface defined by the housing. In various examples of such an implementation, the earphone may determine the non-binary amount of the force upon detection of the touch. In other implementations, the earphone may use signals from both a touch sensor and a force sensor to determine applied force. In a particular embodiment, the first and second force electrodes may be implemented using separate sections of a single flexible circuit. This flexible circuit may flex to allow the first force electrode to move toward the second force electrode when the force is applied. This flexible circuit may also flex to allow the first force electrode to move away from the second force electrode when the force is no longer applied.

In the present disclosure, the methods disclosed may be implemented using one or more sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An earphone, comprising:
   a speaker housing;
   a speaker positioned in the speaker housing;
   a stem extending from the speaker housing, the stem defining a curved interior surface and at least one input surface;
   a flexible circuit coupled to the curved interior surface;
   a touch sensor at least partially disposed within the flexible circuit facing the curved interior surface; and
   a force sensor at least partially disposed within the flexible circuit facing an interior of the stem.

2. The earphone of claim 1, further comprising an integrated circuit coupled to the flexible circuit.

3. The earphone of claim 1, wherein:
   a first portion of the flexible circuit is coupled to a first portion of the curved interior surface; and
   a second portion of the flexible circuit is coupled to a second portion of an interior surface of the stem.

4. The earphone of claim 1, wherein the at least one input surface comprises a first input surface and a second input surface opposite the first input surface.

5. The earphone of claim 4 wherein:
   the force sensor is operable to detect a force applied to the first input surface; and
   the touch sensor is operable to detect a touch applied to the second input surface.

6. The earphone of claim 1, wherein:
   the touch sensor includes a touch sensor electrode; and
   the force sensor includes a force sensor electrode.

7. The earphone of claim 6, further comprising a shield disposed between the touch sensor electrode and the force sensor electrode.

8. An earphone, comprising:
   a speaker housing;
   a speaker positioned in the speaker housing;
   a stem extending from the speaker housing, the stem defining an interior surface and at least one input surface;
   a flexible circuit coupled to the interior surface;
   a touch sensor coupled to the flexible circuit facing the interior surface; and
   a force sensor coupled to the flexible circuit facing an interior of the stem.

9. The earphone of claim 8, wherein the flexible circuit is laminated to the interior surface.

10. The earphone of claim 8, wherein:
    a first portion of the flexible circuit is coupled to a first portion of the interior surface; and
    a second portion of the flexible circuit is coupled to a second portion of the interior surface.

11. The earphone of claim 10 wherein the first portion of the interior surface and the second portion of the interior surface are curved.

12. The earphone of claim 8, further comprising a shield disposed between the touch sensor and the force sensor.

13. The earphone of claim 8, wherein the interior surface is flat.

14. The earphone of claim 8, wherein the flexible circuit is laminated to the interior surface.

15. An earphone, comprising:
    a speaker housing;
    a speaker positioned in the speaker housing;
    a stem extending from the speaker housing, the stem defining an interior surface and at least one input surface;
    a flexible circuit coupled to the interior surface;
    a touch sensor coupled to the flexible circuit; and
    a force sensor coupled to the flexible circuit.

16. The earphone of claim 15, wherein the force sensor comprises a strain gauge.

17. The earphone of claim 15, wherein the touch sensor is a capacitive touch sensor.

18. The earphone of claim 15, wherein the interior surface is curved.

19. The earphone of claim 15, wherein the flexible circuit is coupled to the interior surface using adhesive.

20. The earphone of claim 15, further comprising a shield coupled to the flexible circuit.

* * * * *